US009110310B2

(12) United States Patent
Pugh et al.

(10) Patent No.: US 9,110,310 B2
(45) Date of Patent: Aug. 18, 2015

(54) MULTIPLE ENERGIZATION ELEMENTS IN STACKED INTEGRATED COMPONENT DEVICES

(75) Inventors: Randall B. Pugh, Jacksonville, FL (US); Frederick A. Flitsch, New Windsor, NY (US); Daniel B. Otts, Fruit Cove, FL (US); James Daniel Riall, St. Johns, FL (US); Adam Toner, Jacksonville, FL (US)

(73) Assignee: Johnson & Johnson Vision Care, Inc., Jacksonville, FL (US)

( * ) Notice: Subject to any disclaimer, the term of this patent is extended or adjusted under 35 U.S.C. 154(b) by 103 days.

(21) Appl. No.: 13/358,916

(22) Filed: Jan. 26, 2012

(65) Prior Publication Data

US 2012/0235277 A1 Sep. 20, 2012

Related U.S. Application Data

(60) Provisional application No. 61/454,205, filed on Mar. 18, 2011, provisional application No. 61/454,591, filed on Mar. 21, 2011.

(51) Int. Cl.
*H05K 1/11* (2006.01)
*G02C 7/08* (2006.01)
*B29D 11/00* (2006.01)
(Continued)

(52) U.S. Cl.
CPC .......... *G02C 7/083* (2013.01); *B29D 11/00826* (2013.01); *G02C 7/04* (2013.01); *H01L 23/58* (2013.01); *H01L 25/0657* (2013.01); *H01L 2224/45147* (2013.01); *H01L 2224/48145* (2013.01); *H01L 2225/06506* (2013.01); *H01L 2225/06513* (2013.01); *H01L 2225/06541* (2013.01); *H01L 2225/06562* (2013.01); *H01L 2225/06572* (2013.01); *H01L 2924/00014* (2013.01); *H01L 2924/01015* (2013.01);
(Continued)

(58) Field of Classification Search
CPC .............. B29D 11/00826; H01L 23/58; H01L 25/0657; G02C 7/083; G02C 7/04
USPC ........................................................ 361/790
See application file for complete search history.

(56) References Cited

U.S. PATENT DOCUMENTS 3,375,136 A * 3/1968 Biggar .......................... 429/127
4,601,545 A 7/1986 Kern
(Continued)

FOREIGN PATENT DOCUMENTS

EP 1760515 A2 3/2007
EP 1760515 A2 3/2007
(Continued)

OTHER PUBLICATIONS

International Search Report for PCT PCT/US2012/026849 Date of Jul. 2, 2012.
(Continued)

*Primary Examiner* — David M Sinclair
*Assistant Examiner* — Robert Brown

(57) ABSTRACT

This invention discloses a device comprising multiple functional layers with multiple energization elements formed on substrates, wherein at least one functional layer comprises an electrical energy source. In some embodiments, the present invention includes a component for incorporation into ophthalmic lenses that has been formed by the stacking of multiple functionalized layers.

30 Claims, 15 Drawing Sheets

(51) Int. Cl.
*G02C 7/04* (2006.01)
*H01L 23/58* (2006.01)
*H01L 25/065* (2006.01)

(52) U.S. Cl.
CPC ............ *H01L2924/01047* (2013.01); *H01L 2924/10253* (2013.01); *H01L 2924/13091* (2013.01)

(56) References Cited

U.S. PATENT DOCUMENTS

| | | | | |
|---|---|---|---|---|
| 5,227,805 | A * | 7/1993 | King et al. | 343/702 |
| 5,712,721 | A * | 1/1998 | Large | 359/245 |
| 6,322,589 | B1 | 11/2001 | Cumming | |
| 7,324,287 | B1 * | 1/2008 | Gollier et al. | 359/666 |
| 7,404,636 | B2 | 7/2008 | Blum et al. | |
| 7,410,700 | B2 | 8/2008 | Wang | |
| 7,423,801 | B2 * | 9/2008 | Kaufman et al. | 359/319 |
| 7,581,124 | B1 | 8/2009 | Jacobson et al. | |
| 7,798,301 | B2 | 9/2010 | Keating et al. | |
| 7,876,573 | B2 * | 1/2011 | Motohara et al. | 361/790 |
| 7,968,991 | B2 * | 6/2011 | Wong et al. | 257/686 |
| 7,991,934 | B2 * | 8/2011 | Yao et al. | 710/301 |
| 8,014,164 | B2 * | 9/2011 | Yang | 361/760 |
| 8,014,166 | B2 * | 9/2011 | Yazdani | 361/790 |
| 8,309,397 | B2 * | 11/2012 | Shim et al. | 438/109 |
| 8,343,216 | B2 | 1/2013 | Brady et al. | |
| 8,579,435 | B2 * | 11/2013 | Blum et al. | 351/159.39 |
| 8,950,862 | B2 | 2/2015 | Pugh et al. | |
| 2002/0058151 | A1 * | 5/2002 | Uchikoba et al. | 428/621 |
| 2003/0137922 | A1 * | 7/2003 | Ro et al. | 369/283 |
| 2004/0131925 | A1 | 7/2004 | Jenson et al. | |
| 2004/0239874 | A1 * | 12/2004 | Swab et al. | 351/123 |
| 2005/0099594 | A1 | 5/2005 | Blum et al. | |
| 2005/0231677 | A1 * | 10/2005 | Meredith | 349/143 |
| 2006/0095128 | A1 | 5/2006 | Blum et al. | |
| 2006/0152912 | A1 * | 7/2006 | Karrer et al. | 361/790 |
| 2006/0226556 | A1 * | 10/2006 | Kurita et al. | 257/778 |
| 2006/0265058 | A1 | 11/2006 | Silvestrini | |
| 2007/0090869 | A1 * | 4/2007 | Adewole et al. | 327/425 |
| 2007/0242173 | A1 * | 10/2007 | Blum et al. | 349/13 |
| 2008/0208335 | A1 | 8/2008 | Blum et al. | |
| 2008/0261390 | A1 * | 10/2008 | Chen et al. | 438/613 |
| 2009/0033863 | A1 * | 2/2009 | Blum et al. | 351/160 R |
| 2009/0091818 | A1 | 4/2009 | Haddock et al. | |
| 2009/0175016 | A1 * | 7/2009 | Legen et al. | 361/787 |
| 2009/0204207 | A1 | 8/2009 | Blum et al. | |
| 2009/0243125 | A1 * | 10/2009 | Pugh et al. | 264/1.36 |
| 2009/0244477 | A1 * | 10/2009 | Pugh et al. | 351/158 |
| 2009/0256977 | A1 * | 10/2009 | Haddock et al. | 349/13 |
| 2010/0001926 | A1 | 1/2010 | Amirparviz et al. | |
| 2010/0002190 | A1 | 1/2010 | Clarke et al. | |
| 2010/0072643 | A1 * | 3/2010 | Pugh et al. | 264/2.7 |
| 2010/0073534 | A1 | 3/2010 | Yano et al. | |
| 2010/0076553 | A1 * | 3/2010 | Pugh et al. | 623/6.22 |
| 2010/0078838 | A1 | 4/2010 | Pugh et al. | |
| 2010/0079724 | A1 * | 4/2010 | Pugh et al. | 351/177 |
| 2010/0109175 | A1 | 5/2010 | Pugh et al. | |
| 2010/0110372 | A1 * | 5/2010 | Pugh et al. | 351/177 |
| 2010/0149777 | A1 * | 6/2010 | Yamamoto et al. | 361/790 |
| 2010/0211186 | A1 * | 8/2010 | Senders et al. | 623/24 |
| 2011/0045112 | A1 | 2/2011 | Pugh et al. | |
| 2011/0074281 | A1 * | 3/2011 | Farquhar et al. | 313/504 |
| 2011/0230963 | A1 * | 9/2011 | Cuevas | 623/6.56 |
| 2012/0026598 | A1 | 2/2012 | Pugh et al. | |
| 2012/0057244 | A1 | 3/2012 | Pugh et al. | |
| 2012/0092612 | A1 * | 4/2012 | Binder | 351/159.02 |
| 2012/0236254 | A1 | 9/2012 | Pugh et al. | |
| 2012/0245444 | A1 | 9/2012 | Otis et al. | |
| 2013/0194540 | A1 | 8/2013 | Pugh et al. | |
| 2013/0245754 | A1 | 9/2013 | Blum et al. | |
| 2013/0245755 | A1 | 9/2013 | Fehr et al. | |
| 2014/0036226 | A1 | 2/2014 | Blum et al. | |
| 2014/0148899 | A1 | 5/2014 | Fehr et al. | |
| 2014/0306361 | A1 | 10/2014 | Pugh et al. | |

FOREIGN PATENT DOCUMENTS

| | | |
|---|---|---|
| WO | WO 2005088388 A1 | 9/2005 |
| WO | WO 2007/050402 A2 | 5/2007 |
| WO | WO 2007050402 A2 | 5/2007 |
| WO | WO 2010/051225 A1 | 5/2010 |
| WO | WO 2010051225 A1 | 5/2010 |
| WO | WO 2011/163080 A1 | 12/2011 |
| WO | WO 2011163080 A1 | 12/2011 |

OTHER PUBLICATIONS

PCT International Search Report, dated Oct. 2, 2012 for PCT Int'l Appln. No. PCT/US2012/029796.
European Search Report for Application No. EP 13 15 5410 Date of Completion of Report Jun. 5, 2013.
PCT International Search Report, dated Aug. 7 2013, for PCT Int'l Appln. No. PCT/US2013/023097.

* cited by examiner

MULTIPLE ENERGIZATION ELEMENTS IN STACKED INTEGRATED COMPONENT DEVICES

RELATED APPLICATIONS

This application claims priority to U.S. Provisional Application Ser. No. 61/454,205 filed on Mar. 18, 2011; and U.S. Provisional Application Ser. No. 61/454,591 filed on Mar. 21, 2011; the contents of which are relied upon and incorporated by reference.

FIELD OF USE

This invention describes a device formed from multiple functional layers which are stacked, wherein at least one layer includes a power source as well as, in some embodiments, methods and apparatus for the fabrication of a stacked integrated component device based on multiple stacked layers.

BACKGROUND

Traditionally an ophthalmic device, such as a contact lens, an intraocular lens or a punctal plug included a biocompatible device with a corrective, cosmetic or therapeutic quality. A contact lens, for example, may provide one or more of: vision correcting functionality; cosmetic enhancement; and therapeutic effects. Each function is provided by a physical characteristic of the lens. A design incorporating a refractive quality into a lens may provide a vision corrective function. A pigment incorporated into the lens may provide a cosmetic enhancement. An active agent incorporated into a lens may provide a therapeutic functionality. Such physical characteristics are accomplished without the lens entering into an energized state. A punctal plug has traditionally been a passive device.

More recently, it has been theorized that active components may be incorporated into a contact lens. Some components may include semiconductor devices. Some examples have shown semiconductor devices embedded in a contact lens placed upon animal eyes. It has also been described how the active components may be energized and activated in numerous manners within the lens structure itself. The topology and size of the space defined by the lens structure creates a novel and challenging environment for the definition of various functionality. Generally, such disclosures have included discrete devices. However, the size and power requirements for available discrete devices are not necessarily conducive for inclusion in a device to be worn on a human eye. Technological embodiments that address such an ophthalmological background need generate solutions that not only address ophthalmic requirements but also encompass novel embodiments for the more general technology space of powered electrical devices.

SUMMARY

Accordingly, the present invention includes designs of components that may be combined to form a stacked layer of substrates combined into a discrete package. The stacked layers will include one or more layers which include a power source for at least one component included in the stacked layers. In some embodiments, an insert is provided that may be energized and incorporated into an ophthalmic device. The insert may be formed of multiple layers which may have unique functionality for each layer; or alternatively mixed functionality but in multiple layers. The layers may in some embodiments have layers dedicated to the energization of the product or the activation of the product or for control of functional components within the lens body. In addition, methods and apparatus for forming an ophthalmic lens, with inserts of stacked functionalized layers are presented.

In some embodiments, the insert may contain a layer in an energized state which is capable of powering a component capable of drawing a current. Components may include, for example, one or more of: a variable optic lens element, and a semiconductor device, which may either be located in the stacked layer insert or otherwise connected to it.

In another aspect, some embodiments may include a cast molded silicone hydrogel contact lens with a rigid or formable insert of stacked functionalized layers contained within the ophthalmic lens in a biocompatible fashion, wherein at least one of the functionalized lens includes a power source.

Accordingly, the present invention includes a disclosure of a technological framework for devices formed from multiple stacked layers with energization. In exemplary embodiments, disclosure is made for an ophthalmic lens with a stacked functionalized layer portion, apparatus for forming an ophthalmic lens with a stacked functionalized layer portion and methods for the same. An insert may be formed from multiple layers in various manners as discussed herein and the insert may be placed in proximity to one, or both of, a first mold part and a second mold part. A reactive monomer mix is placed between the first mold part and the second mold part. The first mold part is positioned proximate to the second mold part thereby forming a lens cavity with the energized substrate insert and at least some of the reactive monomer mix in the lens cavity; the reactive monomer mix is exposed to actinic radiation to form an ophthalmic lens. Lenses may be formed via the control of actinic radiation to which the reactive monomer mixture is exposed.

DETAILED DESCRIPTION OF THE INVENTION

Figure 1:
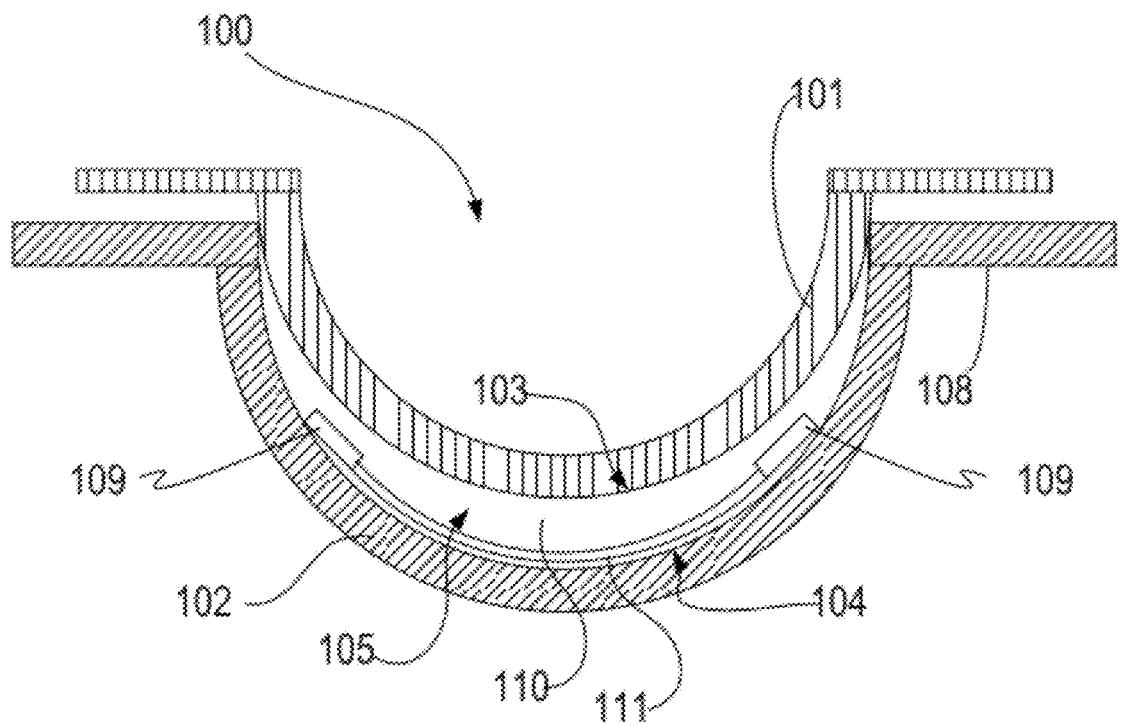
FIG. 1 illustrates a mold assembly apparatus according to previously described embodiments.

The present invention includes a substrate insert device formed through the stacking of multiple functionalized layers. Additionally the present invention includes methods and apparatus for manufacturing an ophthalmic lens with such a stacked functionalized layer substrate as an insert in the formed lens. In addition, some embodiments of the present invention include an ophthalmic lens with a stacked functionalized layer substrate insert incorporated into the ophthalmic lens.

In the following sections detailed descriptions of embodiments of the invention will be given. The description of both preferred and alternative embodiments are exemplary embodiments only, and it is understood that to those skilled in the art that variations, modifications and alterations may be apparent. It is therefore to be understood that said exemplary embodiments do not limit the scope of the underlying invention.

GLOSSARY

In this description and claims directed to the presented invention, various terms may be used for which the following definitions will apply:

Energized: as used herein refers to the state of being able to supply electrical current to or to have electrical energy stored within.

Energy: as used herein refers to the capacity of a physical system to do work. Many uses within this invention may relate to the said capacity being able to perform electrical actions in doing work.

Energy Source: as used herein refers to device or layer which is capable of supplying Energy or placing a logical or electrical device in an Energized state.

Energy Harvesters: as used herein refers to device capable of extracting energy from the environment and convert it to electrical energy.

Functionalized: as used herein refers to making a layer or device able to perform a function including for example, energization, activation, or control.

Lens: refers to any ophthalmic device that resides in or on the eye. These devices may provide optical correction or may be cosmetic. For example, the term lens may refer to a contact lens, intraocular lens, overlay lens, ocular insert, optical insert or other similar device through which vision is corrected or modified, or through which eye physiology is cosmetically enhanced (e.g. iris color) without impeding vision. In some embodiments, the preferred lenses of the invention are soft contact lenses are made from silicone elastomers or hydrogels, which include but are not limited to silicone hydrogels, and fluorohydrogels.

Lens forming mixture or "Reactive Mixture" or "RMM" (reactive monomer mixture): as used herein refers to a monomer or prepolymer material which may be cured and crosslinked or crosslinked to form an ophthalmic lens. Various embodiments may include lens forming mixtures with one or more additives such as: UV blockers, tints, photoinitiators or catalysts, and other additives one might desire in an ophthalmic lenses such as, contact or intraocular lenses.

Lens Forming Surface: refers to a surface that is used to mold a lens. In some embodiments, any such surface 103-104 can have an optical quality surface finish, which indicates that it is sufficiently smooth and formed so that a lens surface fashioned by the polymerization of a lens forming material in contact with the molding surface is optically acceptable. Further, in some embodiments, the lens forming surface 103-104 can have a geometry that is necessary to impart to the lens surface the desired optical characteristics, including without limitation, spherical, aspherical and cylinder power, wave front aberration correction, corneal topography correction and the like as well as any combinations thereof.

Lithium Ion Cell: refers to an electrochemical cell where Lithium ions move through the cell to generate electrical energy. This electrochemical cell, typically called a battery, may be reenergized or recharged in its typical forms.

Substrate insert: as used herein refers to a formable or rigid substrate capable of supporting an Energy Source within an ophthalmic lens. In some embodiments, the Substrate insert also supports one or more components.

Mold: refers to a rigid or semi-rigid object that may be used to form lenses from uncured formulations. Some preferred molds include two mold parts forming a front curve mold part and a back curve mold part.

Optical Zone: as used herein refers to an area of an ophthalmic lens through which a wearer of the ophthalmic lens sees.

Power: as used herein refers to work done or energy transferred per unit of time.

Rechargeable or Re-energizable: as used herein refers to a capability of being restored to a state with higher capacity to do work. Many uses within this invention may relate to the capability of being restored with the ability to flow electrical current at a certain rate for a certain, reestablished time period.

Reenergize or Recharge: To restore to a state with higher capacity to do work. Many uses within this invention may relate to restoring a device to the capability to flow electrical current at a certain rate for a certain, reestablished time period.

Released from a mold: means that a lens is either completely separated from the mold, or is only loosely attached so that it may be removed with mild agitation or pushed off with a swab.

Stacked: as used herein means to place at least two component layers in proximity to each other such that at least a portion of one surface of one of the layers contacts a first surface of a second layer. In some embodiments, a film, whether for adhesion or other functions may reside between the two layers that are in contact with each other through said film.

"Stacked Integrated Component Devices" as used herein and sometimes referred to as "SIC-Devices", refers to the product of packaging technologies that can assemble thin layers of substrates, which may contain electrical and electromechanical devices, into operative integrated devices by means of stacking at least a portion of each layer upon each other. The layers may comprise component devices of various types, materials, shapes, and sizes. Furthermore, the layers may be made of various device production technologies to fit and assume various contours as it may be desired.

DESCRIPTION

An energized lens 100 with an embedded Substrate insert 111 may include an Energy Source 109, such as an electrochemical cell or battery as the storage means for the energy and in some embodiments, encapsulation, and isolation of the materials comprising the Energy Source from an environment into which an ophthalmic lens is placed.

In some embodiments, a Substrate insert also includes a pattern of circuitry, components and Energy Sources 109. Various embodiments can include the Substrate insert locating the pattern of circuitry, components and Energy Sources 109 around a periphery of an optic zone through which a wearer of a lens would see, while other embodiments can include a pattern of circuitry, components and Energy Sources 109 which are small enough to not adversely affect the sight of a contact lens wearer and therefore the Substrate insert can locate them within, or exterior to, an optical zone.

In general, according to embodiments previously described, a Substrate insert 111 is embodied within an ophthalmic lens via automation which places an Energy Source a desired location relative to a mold part used to fashion the lens.

Molds

Referring now to FIG. 1, a diagram of an exemplary mold 100 for an ophthalmic lens is illustrated with a Substrate insert 111. As used herein, the terms a mold includes a form 100 having a cavity 105 into which a lens forming mixture 110 can be dispensed such that upon reaction or cure of the lens forming mixture, an ophthalmic lens of a desired shape is produced. The molds and mold assemblies 100 of this invention are made up of more than one "mold parts" or "mold pieces" 101-102. The mold parts 101-102 can be brought together such that a cavity 105 is formed between the molds parts 101-102 in which a lens can be formed. This combination of mold parts 101-102 is preferably temporary. Upon formation of the lens, the mold parts 101-102 can again be separated for removal of the lens.

At least one mold part 101-102 has at least a portion of its surface 103-104 in contact with the lens forming mixture such that upon reaction or cure of the lens forming mixture 110 that surface 103-104 provides a desired shape and form to the portion of the lens with which it is in contact. The same is true of at least one other mold part 101-102.

Thus, for example, in a preferred embodiment a mold assembly 100 is formed from two parts 101-102, a female concave piece (front piece) 102 and a male convex piece (back piece) 101 with a cavity formed between them. The portion of the concave surface 104 which makes contact with lens forming mixture has the curvature of the front curve of an ophthalmic lens to be produced in the mold assembly 100 and is sufficiently smooth and formed such that the surface of an ophthalmic lens formed by polymerization of the lens forming mixture which is in contact with the concave surface 104 is optically acceptable.

In some embodiments, the front mold piece 102 can also have an annular flange integral with and surrounding circular circumferential edge 108 and extends from it in a plane normal to the axis and extending from the flange (not shown).

A lens forming surface can include a surface 103-104 with an optical quality surface finish, which indicates that it is sufficiently smooth and formed so that a lens surface fashioned by the polymerization of a lens forming material in contact with the molding surface is optically acceptable. Further, in some embodiments, the lens forming surface 103-104 can have a geometry that is necessary to impart to the lens surface the desired optical characteristics, including without limitation, spherical, aspherical and cylinder power, wave front aberration correction, corneal topography correction and the like as well as any combinations thereof.

At 111, a Substrate insert is illustrated onto which an Energy Source 109 may be placed. The Substrate insert 111 may be any receiving material onto which an Energy Source 109 may be placed, in some embodiments may also include circuit paths, components and other aspects useful to use of the energy source. In some embodiments, the Substrate insert 111 can be a clear coat of a material which be incorporated into a lens when the lens is formed. The clear coat can include for example a pigment as described below, a monomer or other biocompatible material. Additional embodiments can include a media comprising an insert, which can be either rigid or formable. In some embodiments, a rigid insert may include an optical zone providing an optical property (such as those utilized for vision correction) and a non-optical zone portion. An Energy Source can be placed on one or both of the optic zone and non-optic zone of the insert. Still other embodiments can include an annular insert, either rigid or formable or some shape which circumvents an optic zone through which a user sees.

Various embodiments also include placing an Energy Source 109 onto Substrate insert 111 prior to placement of the Substrate insert 111 into a mold portion used to form a lens. The Substrate insert 111 may also include one or more components which will receive an electrical charge via the Energy Source 109.

In some embodiments, a lens with a Substrate insert 111 can include a rigid center soft skirt design in which a central rigid optical element is in direct contact with the atmosphere and the corneal surface on respective an anterior and posterior surfaces, wherein the soft skirt of lens material (typically a hydrogel material) is attached to a periphery of the rigid optical element and the rigid optical element also acts as a Substrate insert providing energy and functionality to the resulting ophthalmic lens.

Some additional embodiments include a Substrate insert 111 that is a rigid lens insert fully encapsulated within a hydrogel matrix. A Substrate insert 111 which is a rigid lens insert may be manufactured, for example using microinjection molding technology. Embodiments can include, for example, a poly(4-methylpent-1-ene) copolymer resin with a diameter of between about 6 mm to 10 mm and a front surface radius of between about 6 mm and 10 mm and a rear surface radius of between about 6 mm and 10 mm and a center thickness of between about 0.050 mm and 0.5 mm. Some exemplary embodiments include an insert with diameter of about 8.9 mm and a front surface radius of about 7.9 mm and a rear surface radius of about 7.8 mm and a center thickness of about 0.100 mm and an edge profile of about 0.050 radius. One exemplary micro-molding machine can include the Microsystem 50 five-ton system offered by Battenfield Inc.

The Substrate insert can be placed in a mold part 101-102 utilized to form an ophthalmic lens.

Mold part 101-102 material can include, for example: a polyolefin of one or more of: polypropylene, polystyrene, polyethylene, poly(methyl methacrylate), and modified polyolefins. Other molds can include a ceramic or metallic material.

A preferred alicyclic co-polymer contains two different alicyclic polymers and is sold by Zeon Chemicals L.P. under the trade name ZEONOR. There are several different grades of ZEONOR. Various grades may have glass transition temperatures ranging from 105° C. to 160° C. A specifically preferred material is ZEONOR 1060R.

Other mold materials that may be combined with one or more additives to form an ophthalmic lens mold include, for example, Zieglar-Natta polypropylene resins (sometimes referred to as znPP). An exemplary Zieglar-Natta polypropylene resin is available under the name PP 9544 MED. PP 9544 MED is a clarified random copolymer for clean molding as per FDA regulation 21 CFR (c) 3.2 made available by Exxonmobil Chemical Company. PP 9544 MED is a random copolymer (znPP) with ethylene group (hereinafter 9544 MED). Other exemplary Zieglar-Natta polypropylene resins include: Atofina Polypropylene 3761 and Atofina Polypropylene 3620WZ.

Still further, in some embodiments, the molds of the invention may contain polymers such as polypropylene, polyethylene, polystyrene, poly(methyl methacrylate), modified polyolefins containing an alicyclic moiety in the main chain and cyclic polyolefins. This blend can be used on either or both mold halves, where it is preferred that this blend is used on the back curve and the front curve consists of the alicyclic co-polymers.

In some preferred methods of making molds 100 according to the present invention, injection molding is utilized according to known techniques, however, embodiments can also include molds fashioned by other techniques including, for example: lathing, diamond turning, or laser cutting.

Stacked Functionalized Layer Inserts

Figure 2:
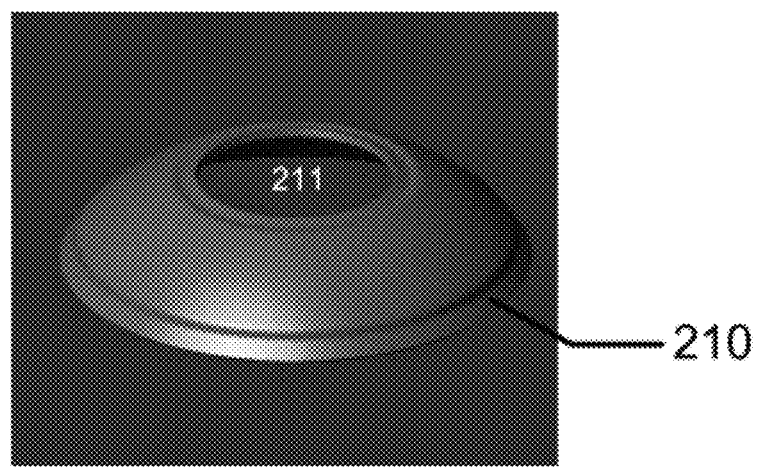
FIG. 2 illustrates an exemplary embodiment of an exemplary form factor for an insert which can be placed within an ophthalmic lens.

Referring now to FIG. 2, an exemplary design of one embodiment of a Substrate insert 111 which has been formed as a Stacked Functionalized Layer Insert is illustrated. This invention relates to novel methods to prepare and form the substrate insert that may be utilized and formed into Ophthalmic Lenses in manners consistent with the previously described art. For clarity of description, but not limiting the scope of the claimed invention, an exemplary Substrate insert 210 is illustrated and described, which comprises a full annular ring with an optical lens area 211. It may be obvious to one skilled in the arts that the inventive art described in this specification has similar application to the various diversity of shapes and embodiments that have been described generically for Substrate inserts of various kinds.

Figure 3:
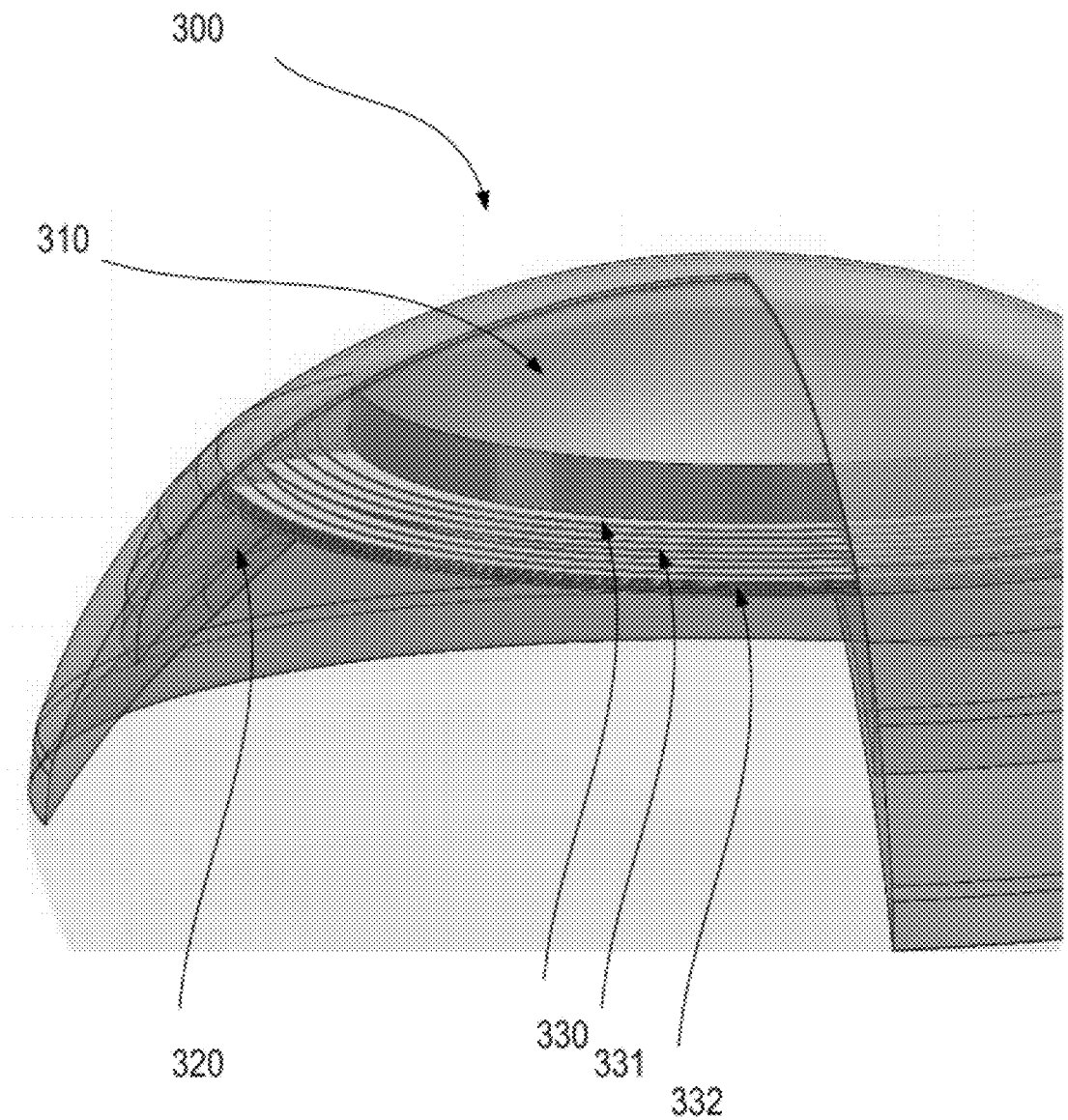
FIG. 3 illustrates a three dimensional representation of an insert formed of stacked functional layers which is incorporated within an ophthalmic lens mold part.

Referring now to FIG. 3 a three dimensional representation is illustrated of some embodiments of a fully formed ophthalmic lens using a stacked layer substrate insert of the type in item 210 is demonstrated as item 300. The representation shows a partial cut out from the ophthalmic lens to realize the different layers present inside the device. Item 320 shows the body material in cross section of the encapsulating layers of the substrate insert. This item surrounds the entire periphery of the ophthalmic lens. It may be clear to one skilled in the arts that the actual insert may comprise a full annular ring or other shapes that still may reside within the constraints of the size of a typical ophthalmic lens.

Items 330, 331 and 332 are meant to illustrate three of numerous layers that may be found in a substrate insert formed as a stack of functional layers. In some embodiments, a single layer may include one or more of: active and passive components and portions with structural, electrical or physical properties conducive to a particular purpose.

In some embodiments, a layer 330 may include an energization source, such as, for example, one or more of: a battery, a capacitor and a receiver within the layer 330. Item 331 then, in a non-limiting exemplary sense may comprise microcircuitry in a layer that detects actuation signals for the ophthalmic lens. In some embodiments, a power regulation layer 332, may be included that is capable of receiving power from external sources, charges the battery layer 330 and controls the use of battery power from layer 330 when the lens is not in a charging environment. The power regulation may also control signals to an exemplary active lens, demonstrated as item 310 in the center annular cutout of the substrate insert.

An energized lens with an embedded Substrate insert may include an Energy Source, such as an electrochemical cell or battery as the storage means for the energy and in some embodiments, encapsulation and isolation of the materials comprising the Energy Source from an environment into which an ophthalmic lens is placed.

In some embodiments, a Substrate insert also includes a pattern of circuitry, components and Energy Sources. Various embodiments may include the Substrate insert locating the pattern of circuitry, components and Energy Sources around a periphery of an optic zone through which a wearer of a lens would see, while other embodiments may include a pattern of circuitry, components and Energy Sources which are small enough to not adversely affect the sight of a contact lens wearer and therefore the Substrate insert may locate them within, or exterior to, an optical zone.

In general, according to these embodiments previously described, a Substrate insert 111 is embodied within an ophthalmic lens via automation which places an Energy Source a desired location relative to a mold part used to fashion the lens.

Figure 4:
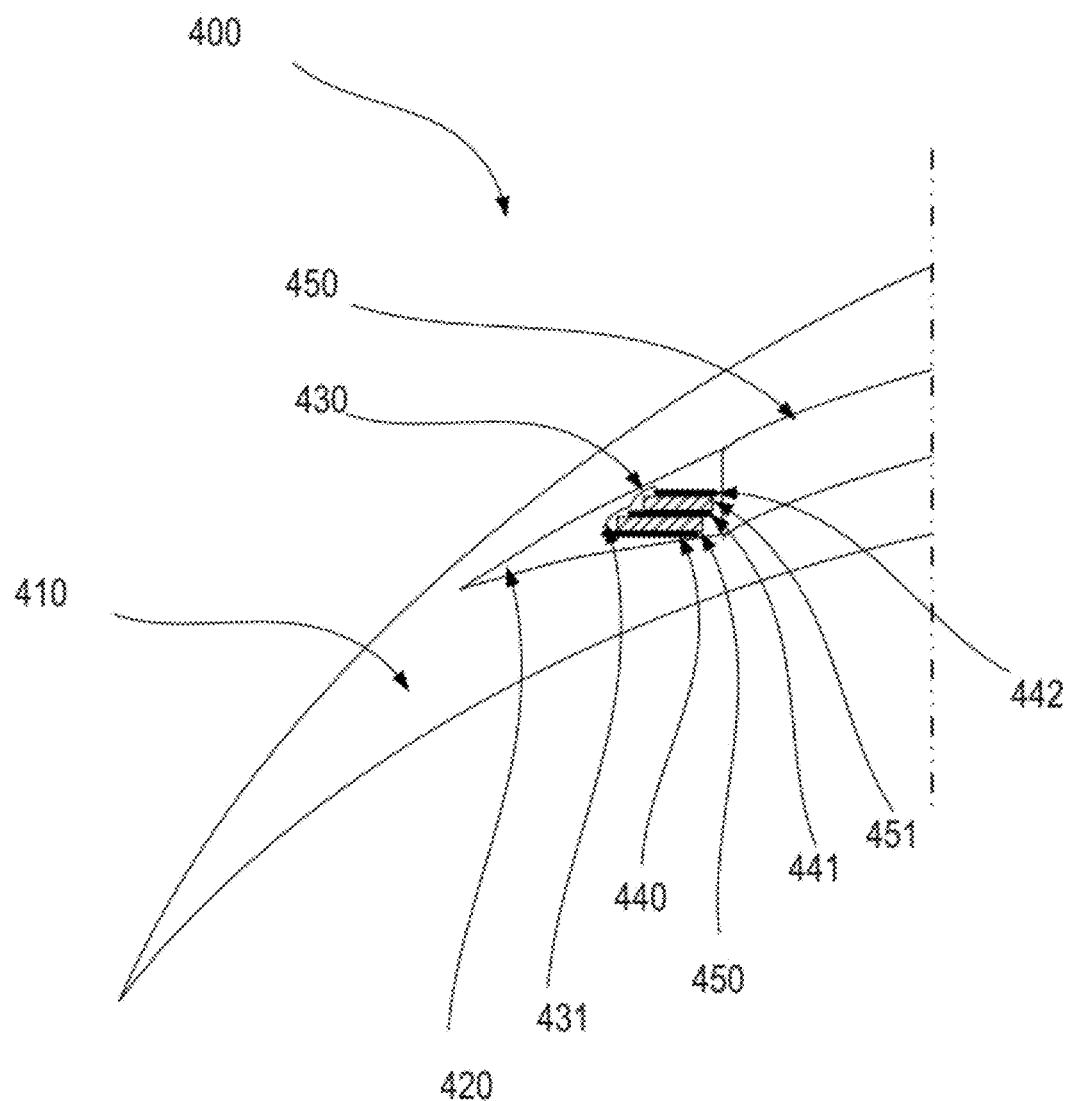
FIG. 4 illustrates a cross sectional representation of an ophthalmic lens mold part with an insert.

FIG. 4 illustrates a closer view of some embodiments of a stacked functional layer insert 400 seen in cross section. Within the body of the ophthalmic lens 410 is embedded the functionalized layer insert 420 which surrounds and connects to an active lens component 450, in some embodiments. It may be clear to one skilled in the arts, that this example shows but one of numerous embodiments of embedded function that may be placed within an ophthalmic lens.

Within the stacked layer portion of the insert are demonstrated numerous layers. In some embodiments the layers may comprise multiple semiconductor based layers. For example, item 440, the bottom layer in the stack, may be a thinned silicon layer upon which circuits have been defined for various functions. Another thinned silicon layer may be found in the stack as item 441. In a non-limiting example, such a layer may have the function of energization of the device. These silicon layers will in some embodiments be electrically isolated from each other through an intervening insulator layer show as item 450. The portions of the surface layers of items 440, 450 and 441 that overlap each other may be adhered to each other through the use of a thin film of adhesive. It may be obvious to one skilled in the arts that numerous adhesives may have the desired characteristics to adhere and passivate the thin silicon layers to the insulator, as in an exemplary sense an epoxy might.

A multiple stacked layer may include additional layers 442, which in an non limiting example may include a thinned silicon layer with circuitry capable of activating and controlling an active lens component. As mentioned before, when the stacked layers need to be electrically isolated from each other, stacked insulator layers may be included between the electrically active layer and in this example item 451 may represent this insulator layer comprising part of the stacked layer insert.

In some of the examples described herein, reference has been made to layers formed from thin layers of silicon. The general art may be extended to different embodiments where the material definitions of the thin stacked layers include, in a non-limiting sense, other semiconductors, metals or composite layers. And the function of the thin layers may include electrical circuitry, but also may include other functions like signal reception, energy handling and storage and energy reception to mention a few examples. In embodiments with different material types, the choice of different adhesives, encapsulants and other materials which interact with the stacked layers may be required. In an example embodiment, a thin layer of epoxy may adhere three silicon layers shown as 440, 441 and 442 with two silicon oxide layers 450 and 451.

Figure 6:
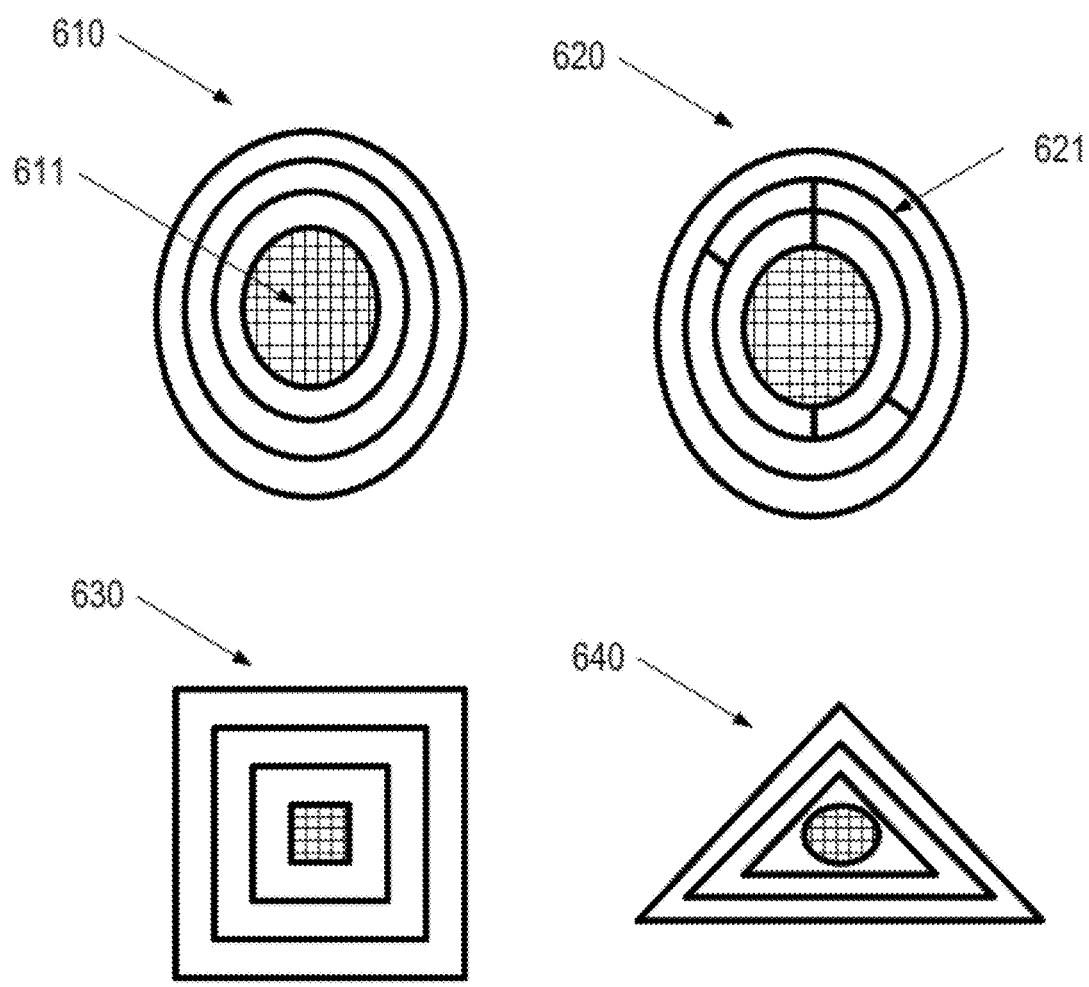
FIG. 6 illustrates different shapes and embodiments of the components used for forming layers in a stacked functional layer insert.

As mentioned in some of the examples the thinned stacked layer may comprise circuits formed into silicon layers. There may be numerous manners to fabricate such layers, however, standard and state of the art semiconductor processing equipment may form electronic circuits on silicon wafers using generic processing steps. After the circuits are formed into the appropriate locations on the silicon wafers, wafer processing equipment may be used to thin the wafers from hundreds of microns thick to thicknesses of 50 microns or less. After thinning the silicon circuits may be cut or "diced" from the wafer into the appropriate shapes for the ophthalmic lens or other application. In later section, different exemplary shapes of the stacked layer invention disclosed herein are shown in FIG. 6. These will be discussed in detail later; however, the "dicing" operation may use various technical options to cut out thin layers with curved, circular, annular, rectilinear and other more complicated shapes.

When the stacked layers perform a function relating to electrical current flow, in some embodiments, there may be a need to provide electrical contact between the stacked layers. In the general field of semiconductor packaging this electrical connection between stacked layers has generic solutions comprising wire bonding, solder bumping and wire deposition processes. Some embodiments of wire deposition may use printing process where electrically conductive inks are printed between two connection pads. In other embodiments, wires may be physically defined by an energy source, like for example a laser, interacting with a gaseous, liquid or solid chemical intermediate resulting in an electrical connection where the energy source irradiates. Still further interconnection definition embodiments may derive from photolithographic processing before or after metal films are deposited by various means.

In the invention herein, if one or more of the layers needs to communicate electrical signals outside itself, it may have a metal contact pad that is not covered with passivating and insulating layers. In many embodiments these pads would be located on the periphery of the layer where subsequent stacked layers do not cover the region. In an example of this type of embodiment, in FIG. 4 interconnect wires 430 and 431 are demonstrated as electrically connecting peripheral regions of layers 440, 441 and 442. It may be apparent to one skilled in the art that numerous layouts or designs of where the electrical connection pads are located and the manner of electrically connecting various pads together. Furthermore, it may be apparent that different circuit designs may derive from the choice of which electrical connect pads are connected and to which other pads they are connected. Still further, the function of the wire interconnection between pads may be different in different embodiments including the functions of electrical signal connection, electrical signal reception from external sources, electrical power connection and mechanical stabilization to mention a few examples.

In a previous discussion, it was presented that non semiconductor layers may comprise one or more of the stacked layers in the inventive art. It may be apparent that there could be a great diversity of applications which may derive from non-semiconductor layers. In some embodiments, the layers may define energizing sources like batteries. This type of layer in some cases may have a semiconductor acting as the supporting substrate for the chemical layers, or in other embodiments may have metallic or insulating substrates. Other layers may derive from layers which are primarily metallic in nature. These layers may define antennas, thermal conductive paths, or other functions. There may be numerous combinations of semiconducting and non-semiconducting layers that comprise useful application within the spirit of the inventive art herein.

In some embodiments where electrical connection is made between stacked layers the electrical connection will need to be sealed after connection is defined. There are numerous methods that may be consistent with the art herein. For example, the epoxy or other adherent materials used to hold the various stacked layers together could be reapplied to the regions with electrical interconnect. Additionally, passivation films may, in some embodiments, be deposited across the entire device to encapsulate the regions that were used for interconnection. It may be apparent to one skilled in the art that numerous encapsulating and sealing schemes may be useful within this art to protect, strengthen and seal the stacked layer device and its interconnections and interconnection regions.

Assembling Stacked Functionalized Layer Inserts

Figure 5:
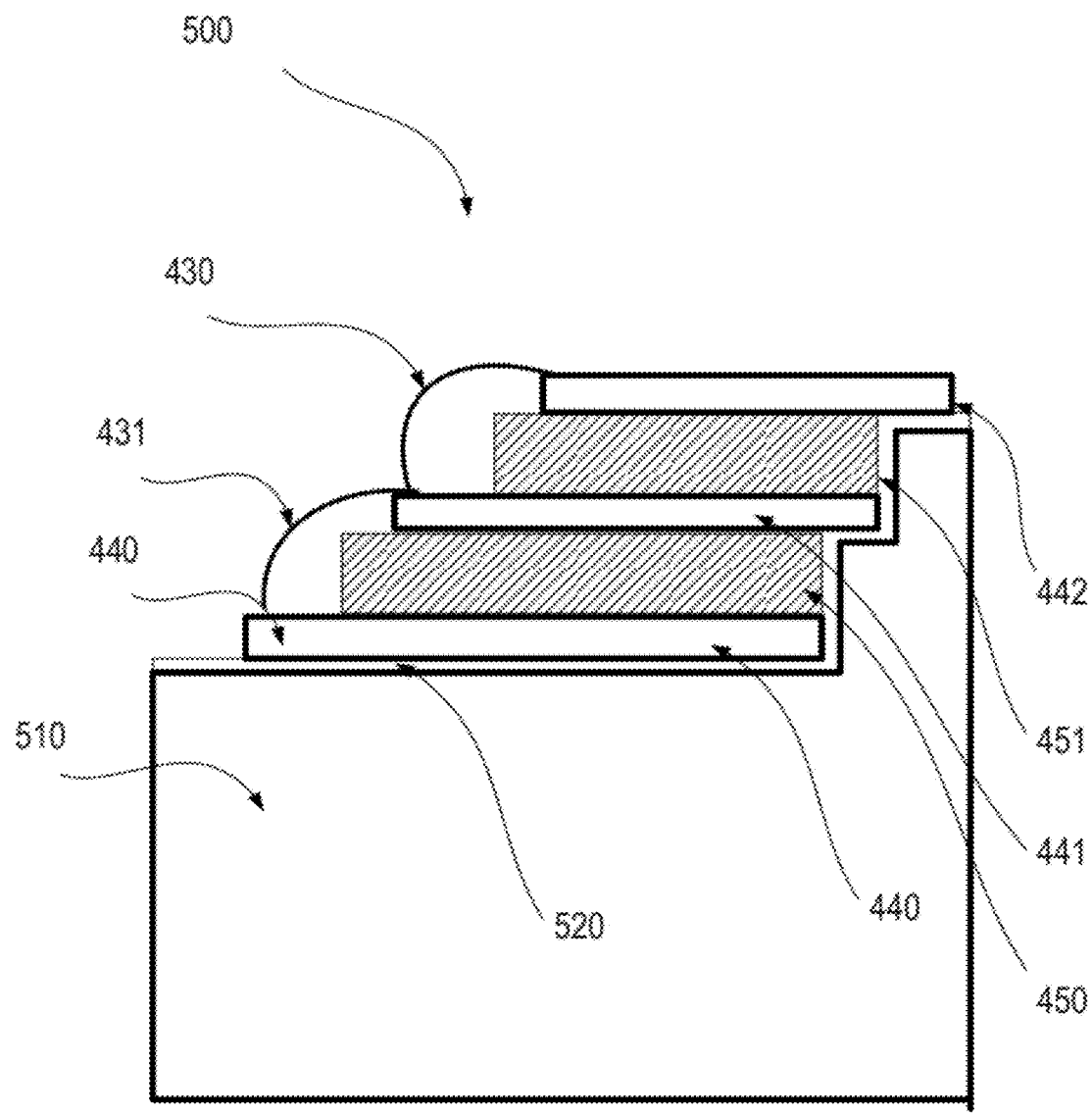
FIG. 5 demonstrates an exemplary embodiment of an insert comprising multiple stacked functional layers upon a supporting and aligning structure.

Proceeding to FIG. 5, item 500, a close up view of an exemplary apparatus to assemble stacked functionalized layer inserts is demonstrated. In the example, a stacking technique where the stacked layers do not align on either side of the layer is shown. Items 440, 441 and 442 again may be silicon layers. On the right side of the Fig. it may be seen that the right side edge of the items 440, 441 and 442 do not align with each other, as they may in alternative embodiments. Such a stacking methodology may allow the insert to assume a three dimensional shape similar to that of the general profile of an ophthalmic lens. In some embodiments as well, such a stacking technique may allow for the layers to be made from the largest surface area as possible. In layers that are functional for energy storage and circuitry such surface area maximization may be important.

In general many of the features of the previously described stacked inserts may be observed in FIG. 5 including stacked functional layers 440, 441 and 442; stacked insulating layers 450 and 451; and interconnections 430 and 431. Additionally a supporting jig, item 510, may be observed to support the stacked functionalized layer insert as it is being assembled. It may be apparent that the surface profile of item 510 may assume a large number of shapes which will change the three dimensional shape of inserts made thereon.

In general, a jig 510 may be provided with a predetermined shape. It may be coated with different layers, item 520, for a number of purposes. In a non-limiting exemplary sense, the coating may first comprise a polymer layer that will allow easy incorporation of an insert into the base material of an ophthalmic lens, and may even be formed from a polysilicone material in some embodiments. An epoxy coating may then be deposited upon the polysilicone coating to adhere the bottom thin functional layer 440 to the coating 520. The bottom surface of a next insulating layer 450 may then be coated with a similar epoxy coating and then placed into its appropriate location upon the jig. It may be clear that the jig may in some embodiments have the function of aligning the correct placement of the stacked layers relative to each other as the device is assembled. In repetitious fashion, the rest of the insert may then be assembled, the interconnections defined and then the insert encapsulated. In some embodiments, the encapsulated insert may then be coated from the top with a polysilicone coating. In some embodiments that use a polysilicone coating for item 520, the assembled insert may be dissociated from the jig 510 by hydration of the polysilicone coating.

The jig 510 may be formed from numerous materials. In some embodiments, the jig may be formed and made of similar materials that are used to make molding pieces in the manufacture of standard contact lenses. Such a use could support the flexible formation of various jig types for different insert shapes and designs. In other embodiments the jig may be formed from materials that either in their own right or with special coatings will not adhere to the chemical mixtures used to adhere the different layers to each other. It may be apparent that numerous options may exist for the configuration of such a jig.

Another aspect of the jig demonstrated as item 510 is the fact that its shape physically supports the layers upon it. In some embodiments the interconnection between the layers may be formed by wire bonding connection. In the process of wire bonding significant force is applied the wire to ensure it forms a good bond. Structural support of the layers during such bonding could be important and could be performed by the supporting jig 510.

Still another function of the jig demonstrated as item 510 is that the jig may have alignment features on it that allow for the alignment of pieces of the functionalized layers to be aligned both relative to each other linearly and radially along the surfaces. In some embodiments, the jig may allow the alignment of azimuthal angle of the functional layers relative to each other around a center point. Regardless of the ultimate shape of the insert produced it may be apparent that the assembly jib may be useful in insuring that the pieces of the insert are properly aligned for their function and correct interconnection.

Proceeding to FIG. 6, a more generalized discussion of shapes of stacked layer inserts may be had. In a subset of the generality of shapes consistent with the art, some sample variation in shape is shown. For example, item 610 shows a top view of a stacked insert which has been formed from essentially circular layer pieces. In some embodiments, the region shown with cross hatching 611 may be an annular region where layer material has been removed. However, in other embodiments, it may be apparent that the pieces of the stacked layers used form the insert could be disks without an annular region. Although, such a non-annular insert shape may be of limited utility in an ophthalmic application the spirit of the inventive art herein is not intended to be limited by the presence of an internal annulus.

Item 620 may in some embodiments demonstrate different embodiments of a stacked functional layer insert. As shown in item 621, in some embodiments the layer pieces may be discrete not only in the stacking direction but also around the azimuthal direction perpendicular to the stacking direction. In some embodiments, semicircular pieces may be used to form the insert. It may be apparent that in shapes that have an annular region, which partial shapes could be useful to reduce the amount of material that would need to be "diced" or cut out after the layer material is formed into its function.

Proceeding further, item 630 demonstrates that non radial, non-elliptical and non-circular insert shapes could be defined. As shown in item 630, rectilinear shapes may be formed, or as in item 640 other polygonal shapes. In a three dimensional perspective pyramids, cones and other geometrical shapes could result from the different shapes of the individual layer pieces used to form the insert. In the three dimensional perspective it may be noted that the individual layers which have heretofore been represented as planar or flat layer piece themselves may assume degrees of freedom in three dimensions.

When the silicon layers are thinned sufficiently they are able to bend or contort around their typical flat planar shape. This additional degree of freedom for thin layers allows for even further diversity of shapes that may be formed with stacked integrated component devices.

In a more general sense it may be apparent to one skilled in the arts that a vast diversity of component shapes may be formed into device shapes and products to make stacked integrated component devices, and these devices may assume a wide diversity of functionality, including in a non-limiting sense energization, signal sensing, data processing, communications both wired and wireless, power management, electromechanical action, control of external devices and the broad diversity of function that layered components may provide.

Powered Layers

Figure 7:
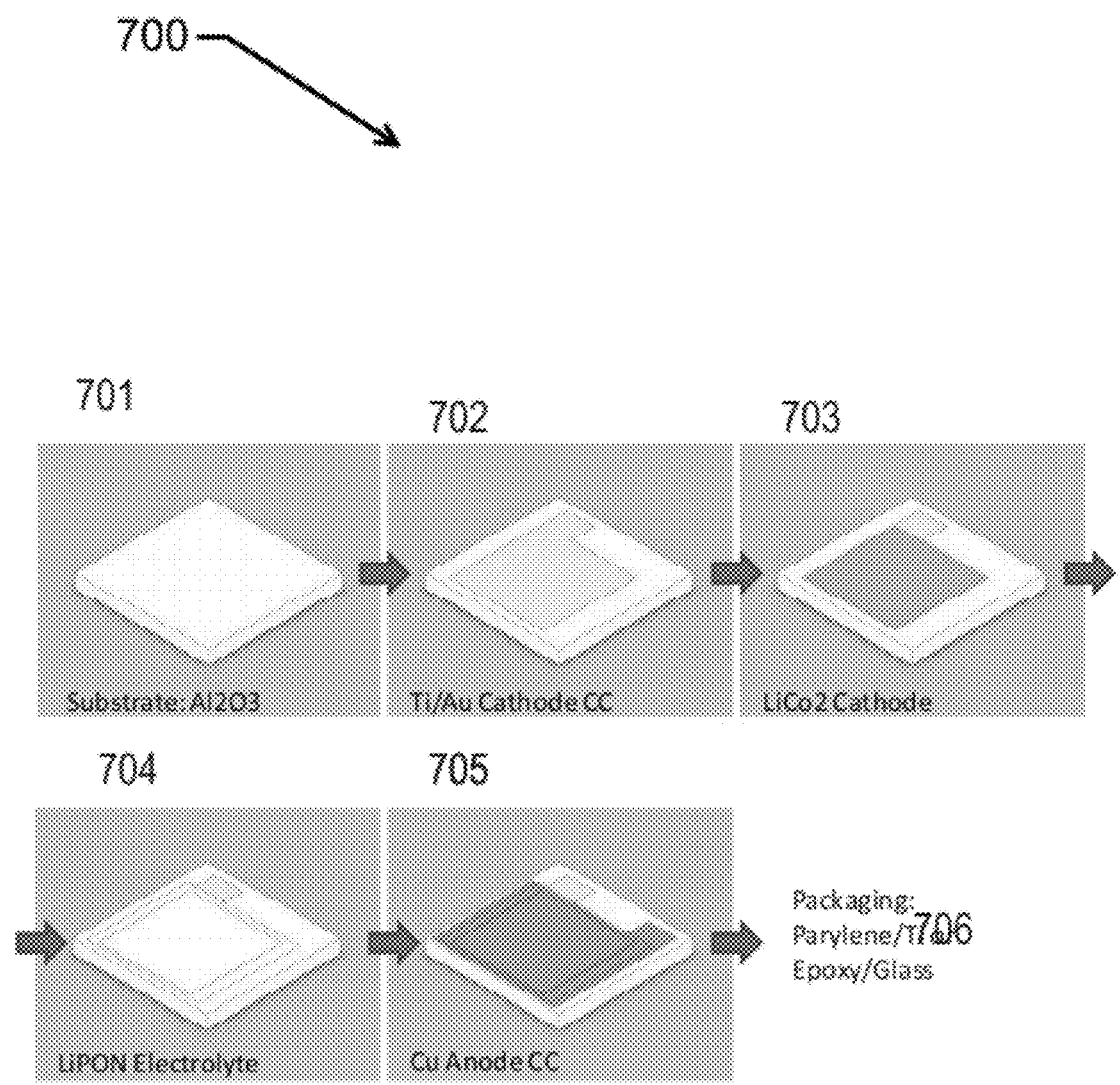
FIG. 7 illustrates a block diagram of some embodiments of a power source layer.

Referring now to FIG. 7, item 700, in some embodiments, one or more layers of a functionalized stack of substrates may include a thin film electrical power source, 706. The thin electrical power source may be viewed essentially as a battery on a substrate.

A thin film battery (sometimes referred to as a TFB) may be structured on a suitable substrate, such as silicon, using known deposition processes to deposit materials in thin layers or films. In some embodiments the deposition process for one of these thin film layers may include, sputter deposition and may be used to deposit various materials. After a film is deposited, it may be processed before a next layer is deposited. A common process on a deposited film may include lithography or masking techniques that then allow etching or other material removing techniques to be performed thus allowing the film layer to have a physical shape in the two dimensions of the substrate surface.

In FIG. 7, item 700 an exemplary thin film processing flow may be depicted. A thin film battery will typically be built upon a substrate, in this flow the substrate is depicted in an exemplary sense as an Aluminum Oxide ($Al_2O_3$), item 701. A typical layer for electrical contact may next be deposited upon the substrate as shown in the FIG. 7 as item 702 where a cathode contact may be formed by a thin film deposition of Titanium and Gold upon the substrate. As may be apparent in FIG. 7 this film may then be patterned and etched, for example by a sputter etch technique or a wet etch technique to yield the shape as shown in item 702. A next step in an exemplary process would be to form the cathode layer as a film upon the cathode contact, item 703. One of the commonly utilized cathode films may include Lithium Cobalt Oxide ($LiCoO_2$) and as shown in FIG. 7, it too may have patterning processes performed upon it. A next step, as shown as item 704, may be to deposit a thin film to form an electrolyte layer in the battery. There may be numerous material choices and forms for the electrolyte layer, but in an exemplary sense a polymer layer of Lithium Phosphorous OxyNitride (LiPON) may be used. Proceeding further to item 705, the thin film stack may be further processed with a deposition of Lithium for an anode layer and then a copper layer to act as the anode contact layer and like the other layers then imaged for an appropriate shape for contact features or other similar features. The thin film battery may in some embodiments then be realized by encapsulating the film stack in passivation and sealing layers. In exemplary fashion, the layers may be encapsulated with Parylene and Titanium or with Epoxy and Glass layers as shown in item 706. As with other layers there may be patterning and etching of these final layers, for example to expose features where the encapsulated battery may be electrically contacted to. It may be apparent to one skilled in the art, that there are an abundant set of material choices for each of the layers that may define embodiments within the spirit of the art disclosed herein.

As described for item 706, some embodiments will include enclosure in packaging to preventingress of one or more of: oxygen, moisture, other gasses and liquids. These embodiments may therefore include packaging in one or more layers which may include one or more of an insulating layer, which as a non-limiting may include for example parylene, and an impermeable layer, which may include for example metals, aluminum, titanium, and similar materials which form an impermeable film layer. An exemplary means of forming these layers may include application by deposition onto a formed thin film battery device. Other methods of forming these layers may include applying organic materials, as for example epoxy, in conjunction with pre-shaped impermeable materials. In some embodiments the preshaped impermeable material may include the next layer of the integrated component device stack. In other embodiments the impermeable material may include a precision formed/cut glass, alumina, or silicon cover layer.

In some embodiments, such as for example, a stacked integrated component device for an ophthalmic device; a substrate may include one that is able to withstand high temperatures, as for example 800 deg. C., without chemical change. Some substrates may be formed from material which provides electrical insulation and alternatively some substrates may be electrically conductive or semi-conductive. These alternative aspects of the substrate material, nonetheless, may be consistent with a final thin film battery that may form a thin component which may be integrated into a stacked integrated component device and provide at least in part the energization function of the device.

In some embodiments of a thin film battery where the thin film battery is a thin component of a stacked integrated device, the battery may have connection to the other thin components through access with opening in the passivation films at the contact pads shown as items 750 on item 706 of FIG. 7 item 700. In additional embodiments, contact may be made through contact pads on the reverse side of the substrate from that shown for items 750. Contact pads on the reverse side could be electrically connected to the thin film battery through the use of a via that is formed through the substrate which has a conductive material on the via sidewalls or filling the via. Finally, there may also be embodiments where both contact pads on the top and bottom of the substrate are formed. Some of these contact pads may intersect the contact pads of the thin film battery, but alternative embodiments may include contact pads through the substrate where no connection is made to the battery. As may be apparent to one skilled in the arts, there may be numerous manners to interconnect through and to interconnect within a substrate upon which a thin film battery is formed.

A set of differing embodiments of the art presented herein may relate to the functions that the electrical connections may perform. Some interconnections may provide an electrical connection path for components within the stack of integrated component devices and their interconnection with devices outside the integrated component device stack. In some of the embodiments that relate to connection outside of the device stack, this connection is made via a direct electrical conduction path. Still other embodiments derive when the connection outside of the package is made in a wireless manner; wherein the connection is made through a manner including radio frequency connection, capacitive electrical communication, magnetic coupling, optical coupling or another of the numerous means that define manners of wireless communication.

Wire Formed Power Source

Figure 8:
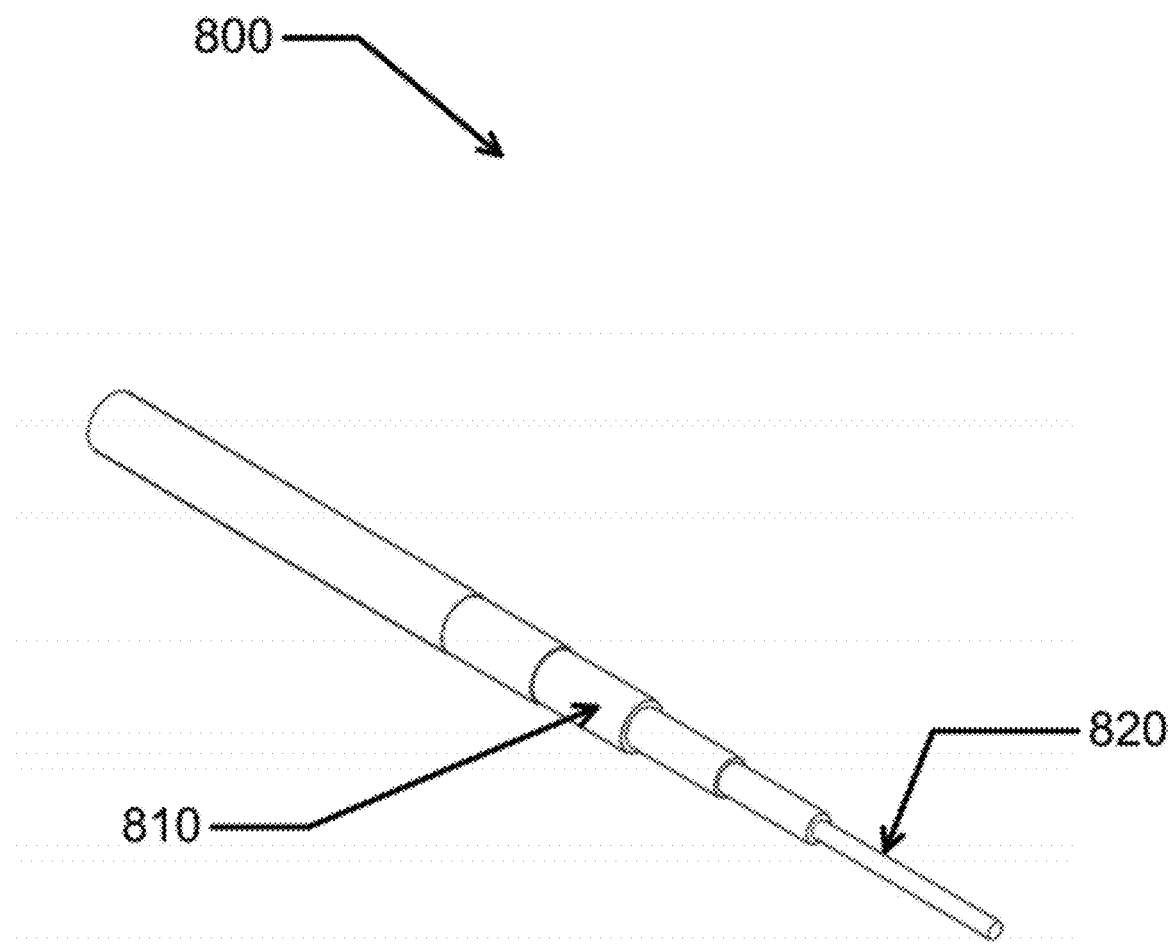
FIG. 8 illustrate an exemplary embodiment of form factor for a wire based power source.

Referring now to FIG. 8, an exemplary design of some embodiments of a power source, item 800, which includes a battery, 810, formed about a conductive wire, 820, are depicted. In some embodiments, item 820 may include a fine gauge copper wire, which may be used as a support. Various battery component layers, which schematically are demonstrated as the rings evident in item 810, may be built up using batch or continuous wire coating processes. In this manner, a very high volumetric efficiency, which may in some embodiments reach or exceed 60% of active battery materials, can be achieved in a convenient form factor that is flexible. In some embodiments, a thin wire may be utilized to form small batteries, such as, in a non-limiting example, a battery whose stored energy may include a range measured by milliamp hours. The voltage capability, in some embodiments of such a wire based battery component, may be approximately 1.5 volts. It may be apparent to a skilled artisan, that larger batteries and higher voltages may also be scaled, for example by designing the end device to connect single batteries in parallel or in series. The numerous manners in which the inventive art may be used to create useful battery devices are within the scope of the present invention.

Figure 9:
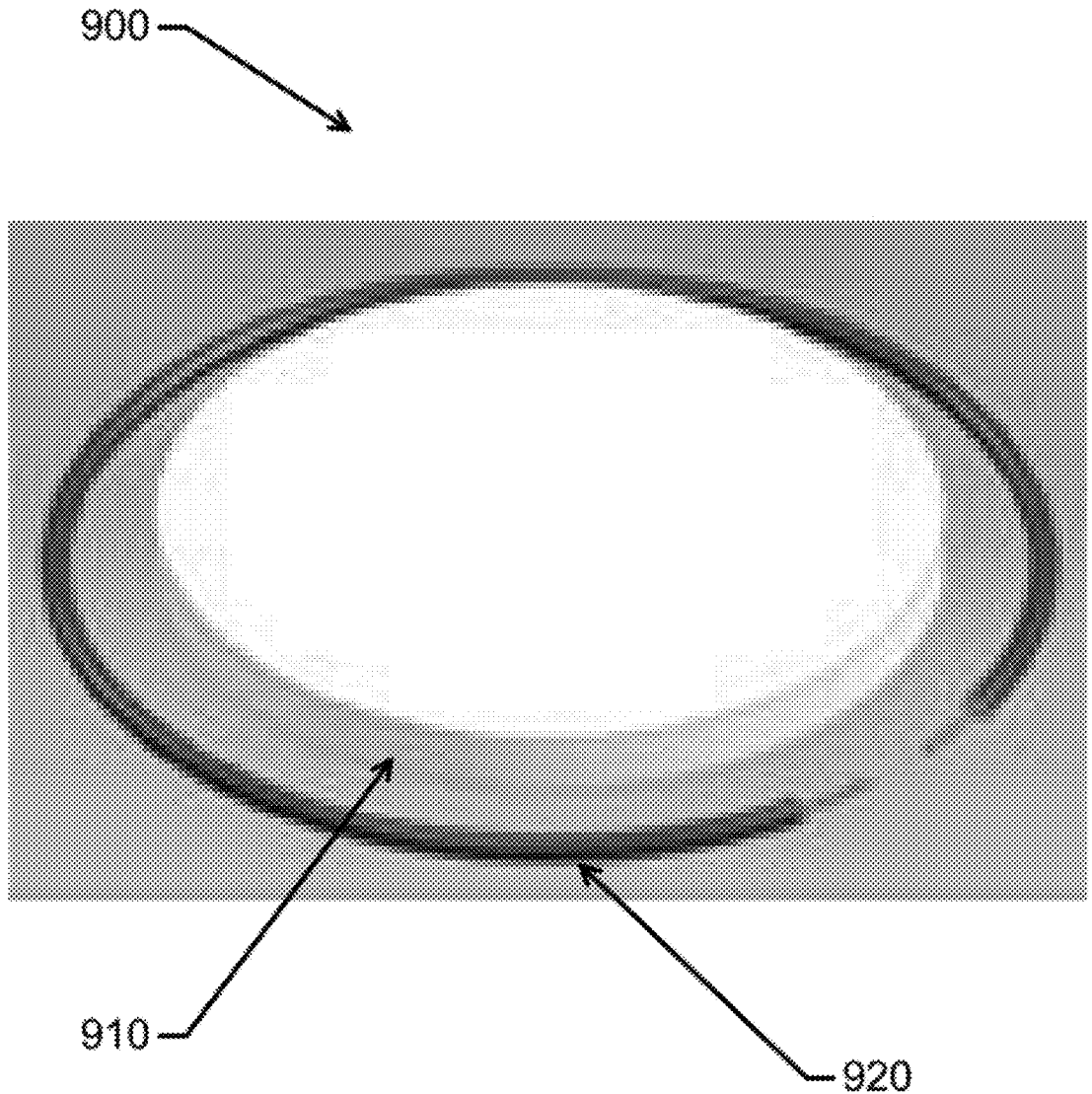
FIG. 9 illustrates the shape of an exemplary wire based power source relative to an exemplary ophthalmic lens component.

Referring to FIG. 9, item 900, a depiction of how a wire based battery component may be combined with other components to create embodiments of the inventive art is made. In an example, item 910 may represent an ophthalmic device whose function may be controlled or altered by electrical means. When such a device is part of a contact lens, the physical dimensions that components occupy may define a relatively small environment. Nevertheless, a wire based battery; item 920 may have an ideal form factor for such an embodiment, existing on the periphery of such an optical component in a shape that a wire may be formed into.

Figure 10:
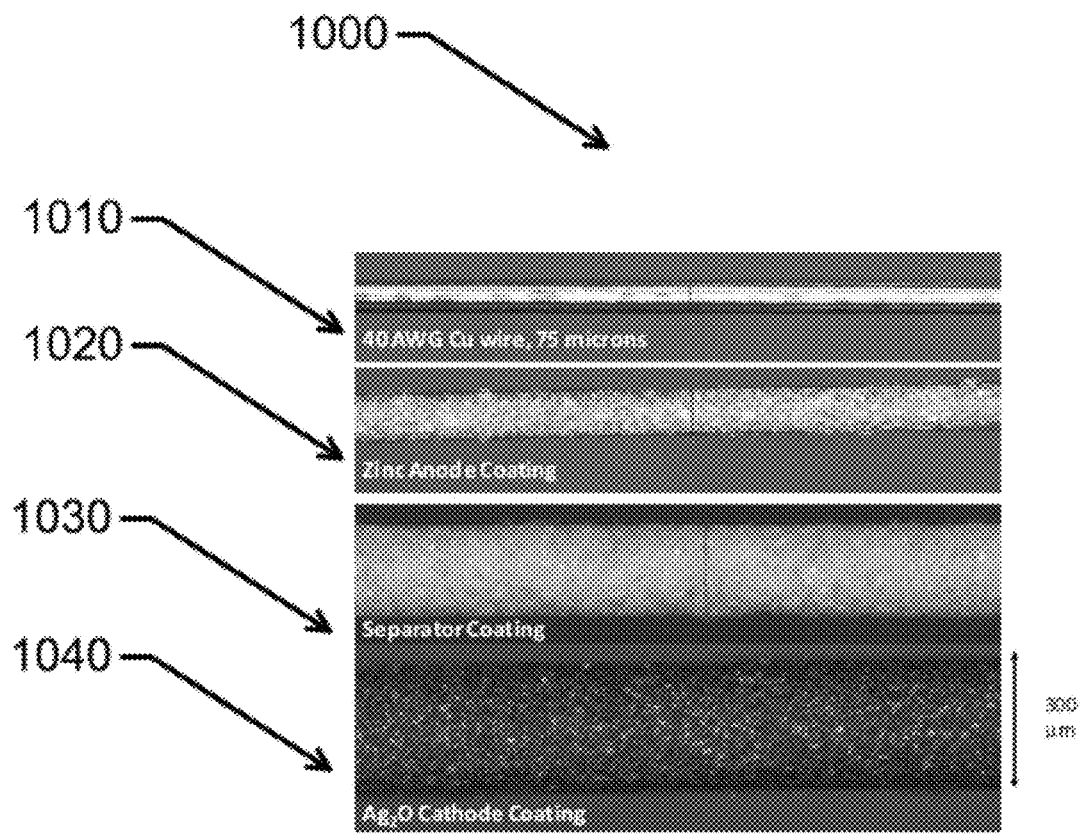
FIG. 10 illustrates a cross sectional diagram of the radial film layers of an exemplary wire based power source.

Referring now to FIG. 10, item 1000, the result of processing using an exemplary method for forming wire batteries is illustrated. These methods and the resulting products define some embodiments of a wire based battery. Initially, a copper wire, item 1010, of high purity such as those available from a commercial source, for example McMaster Carr Corp. may be chosen and then coated with one or more layers. It may be apparent that there exist numerous alternative choices of the type and composition of the wire that may be used to form wire based batteries.

In some embodiments, a zinc anode coating may be used to define an anode for the wire battery as shown as item 1020. The anode coating may be formulated from zinc metal powder, polymer binders, solvents, and additives. The coating may be applied and immediately dried. In some embodiments, multiple passes of the same coating may be used to achieve a desired thickness.

Continuing with FIG. 10, the anode and cathode of the wire battery may be separated from each other. A separator coating, item 1030, may be formulated from non-conductive filler particles, polymer binders, solvents, and additives. In some embodiments the method of application of the separator may be a coating application method similar to that used to coat the anode layer 1020.

A next step in processing the exemplary wire battery of item 1000 is forming a cathode layer. In some embodiments this cathode, item 1040 may be formed with silver oxide cathode coating. This silver oxide coating may be formulated from $Ag_2O$ powder, graphite, polymer binders, solvents, and additives. In similar fashion to the separator layer a common coating application method may be used as was used for other layers of the wire battery.

After a collector is formed, the exemplary wire battery may be coated with a layer to collect current from the cathode layer. In some embodiments, this layer may be a conductive layer from a carbon impregnated adhesive. In other embodiments, this layer may be a metal, for example Silver, impregnated adhesive. It may be apparent to one skilled in the art that there are numerous materials that may support forming a layer to enhance the collection of current along the battery surface. Electrolyte (potassium hydroxide solution with additives) may be applied to the finished battery to complete construction.

In some embodiments of a wire battery, the layers that are used to form the battery may have an ability to evolve gasses. In these embodiments, the materials that form the battery layers may have a sealant layer placed around the battery layers to contain the electrolyte and other materials within the confines of the battery and to protect the battery from mechanical stresses. Nevertheless, for embodiments that may evolve gasses, this sealant layer is typically formed in a manner that allows the diffusion of the evolved gasses through the layer. In some embodiments, such a sealant layer may include silicone or fluoropolymer coatings; however, any material which is used in the state of the art to encapsulate batteries of this type may define embodiments within the scope of the art defined herein.

Components of Stacked Multilayer Interconnection

As mentioned in prior description, the layers of a stacked integrated component device may typically have electrical and mechanical interconnections between them. Some embodiments have been described where certain interconnection schemes, as for example wire bonds, are included in sections preceding this discussion. Nevertheless, it may be helpful to summarize some of the types of interconnection in their own right to help in explanation of the art.

One of the common types of interconnection embodiments derives from the use of a "solder ball." A solder ball interconnection is a type of packaging interconnection that has been used for decades in the semiconductor industry, typically in so-called "flip chip" applications where chips are connected to their packaging by inverting a diced electronic "chip," that has deposited solder balls on its interconnections, onto a package that has aligned connection pads to connect to the other side of the solder ball. Heat treatment may allow the solder ball to flow to a certain degree and form an interconnection. The state of the art has continued its progress so that the solder ball type of interconnection may define an interconnection scheme that occurs on either or both sides of a layer. Additional improvement has occurred to decrease the dimension of solder balls that may reliably be used to form interconnections. In some embodiments, the size of the solder ball may be 50 microns in diameter or smaller.

When a solder ball interconnection is used between two layers, or more generally when an interconnection scheme is used that creates gaps between two layers, some embodiments use a process step of "underfill" to place adhesive material into the gaps to provide adhesive mechanical connection and mechanical support of the two layers. There are numerous manners to underfill a set of layers that have been interconnected. In some manners the underfill adhesive is pulled into the gap area by capillary action. In other embodiments, the underfill adhesive may be made to flow into a gap by pressurizing the liquid into the gap region. Still other embodiments may derive by forming an evacuated state in the gap area by pulling a vacuum upon the layered device and then following this with application of the underfill material. Any of the numerous manners to underfill a gap in two layered materials are consistent with the art herein described.

Another evolving technology of interconnection relates to interconnection of one side of a layered component to the other side by a via that cuts through the layer—such a feature is typically called a through via. The technology has also been around for decades in various forms, however the state of the art has improved where very small vias in the 10 micron or less diameter dimension are possible with extremely large aspect ratios possible as well, especially when the layered material is formed of Silicon. Regardless of the layer material, a through via may form an electrical interconnection between the two surfaces of a layer with a metallic; however, when the layer is a conductive or semiconductive material, the through via must have an insulator layer insulating the metallic interconnection from the layer itself. In some embodiments the through via may penetrate through the entire layered substrate. Other embodiments may have the through via penetrate the substrate but then intersect with a deposited feature on the surface of the substrate; from the back side.

In some embodiments of through vias where the via intersects with a metal pad on one side of the layer that metal pad may be interconnected to a different layer with numerous manners including solder balls and wire bonds. In other embodiments where the via is filled with metal and penetrates the entire layered substrate it may be useful for interconnections to be formed by solder balls on both sides of the interconnecting via.

Another embodiment of interconnection occurs when a layer is formed which only has through vias and metal routing line upon it. In some cases, such an interconnection device may be called an interposer. Since the interposer layer may only have metal routings and via interconnections there are some additional materials that the layer may be made of and therefore alternative embodiments for how to create through vias in these materials may derive. As a non-limiting example, a silicon dioxide or quartz substrate may be the material of the layer. In some cases this quartz layer may be formed by pouring melted quartz upon a substrate where metallic filaments protrude from the surface. These protrusions then form the metallic connections between the top and bottom surface of the quartz layer that results from this type of processing. The numerous manners of forming thin interconnecting layers comprise art useful in interconnecting stacked layers and therefore in the forming of stacked integrated component devices.

Another type of interconnection element is derived from the through substrate via art. If a through substrate via is filled with various layers including metal layers the resulting via may form a structure that can be cut. In some embodiments the via may be cut or "diced" down its center forming a cut out half via. Some embodiments of this type may be termed castellation interconnections. Embodiments of these types provide connection from a top surface to a bottom surface and the ability of interconnections from these surfaces; but as well the potential for interconnection from the side may derive from the structure of the "Castellation."

A number of interconnection and component integration technologies have been discussed herein and in a general perspective these may relate to embodiments that are within the scope of the inventive art herein. Nevertheless, the invention disclosed herein is intended to embrace a wide diversity of integration technologies and the examples, which are intended for illustration purposes, are not intended to limit the scope of the art.

Stacked Integrated Component Devices with Energization

Figure 11:
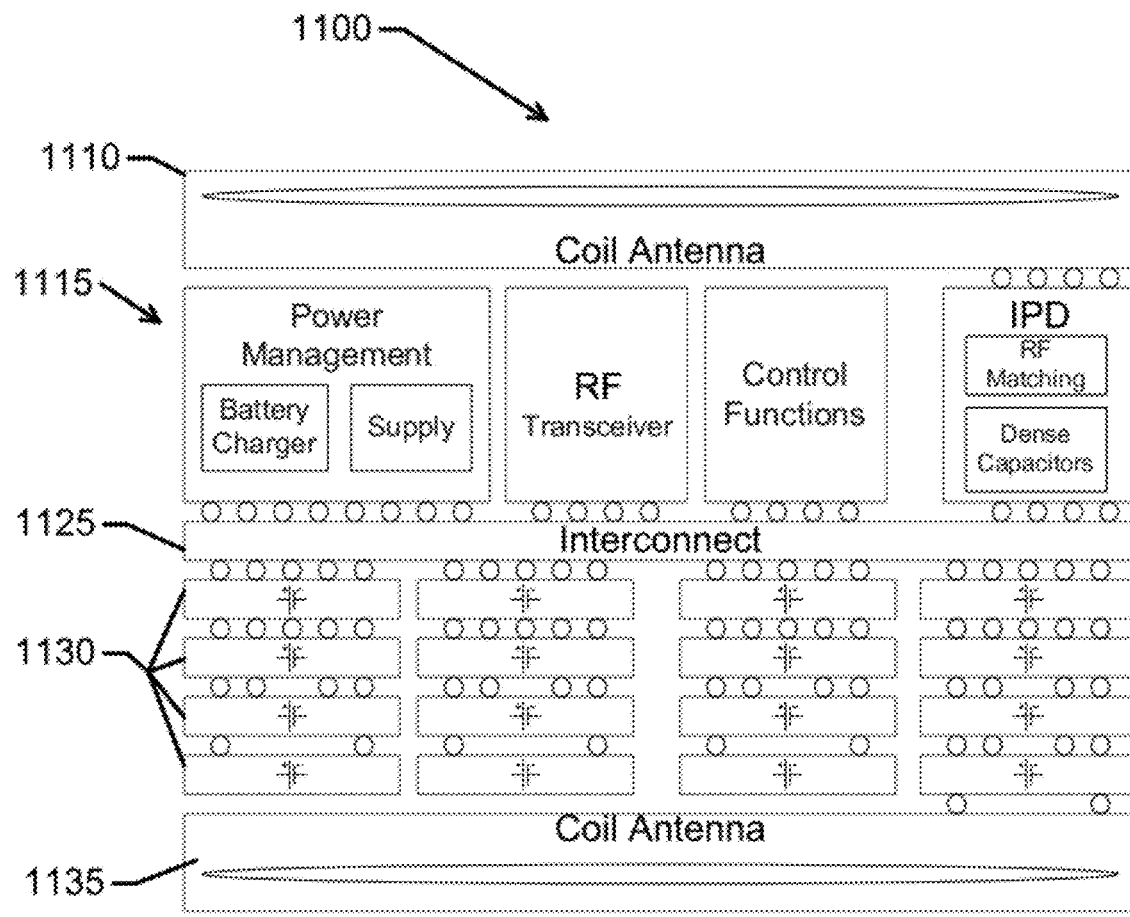
FIG. 11 illustrates an exemplary stacked integrate component device with components from multiple technologies and energization sources.

Proceeding to FIG. 11, item 1100 an exemplary embodiment shows a Stacked Integrated Component Device with energization where there are 8 stacked layers present. There is a top layer 1110, which acts as a wireless communication layer. There is a technology layer 1115, which connects to the top layer 1110 and to an interconnect layer 1125 below it. Furthermore, there are 4 battery layers depicted as item 1130. In some embodiments, there would be a lower substrate layer, item 1135 where the substrate includes an additional antenna layer. There may be numerous functions that an embodiment like this could perform.

Multiple Energization Elements in Stacked Integrated Component Devices

Figure 12:
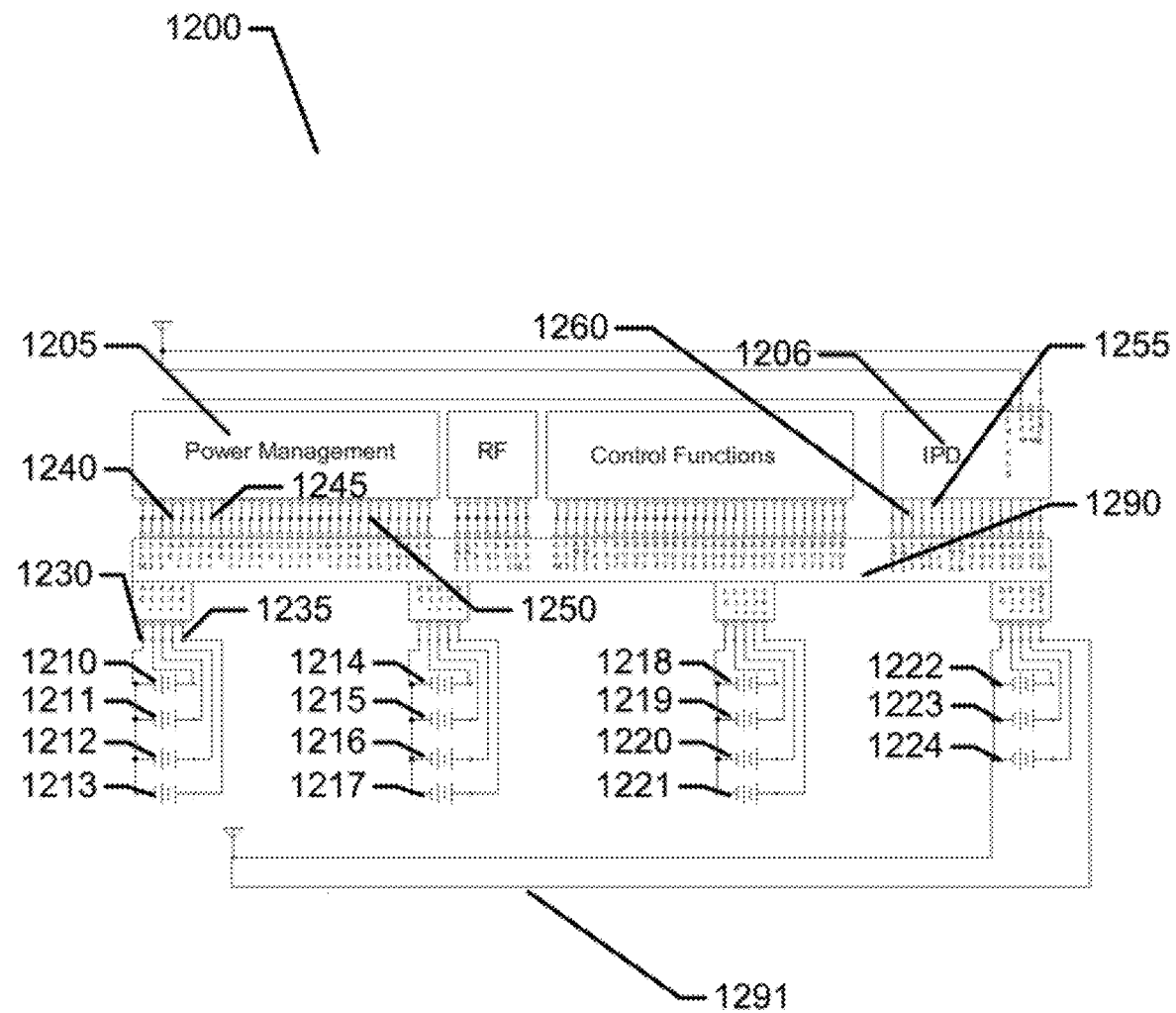
FIG. 12 illustrates an exemplary circuit diagram for a stacked integrated component device with multiple energization elements.

Proceeding now to FIG. 12, item 1200, a schematic representation of an embodiment of the type shown in FIG. 11 may be seen. The multiple energization elements that were identified as items 1130 in FIG. 11 are now represented by individual identifiers. It may be apparent that the number and organization of the multiple elements are but one of many different arrangements and are depicted for illustrative purposes. Nevertheless, in some embodiments, as shown the elements may be arranged in 4 banks of 3 or 4 elements as shown by items 1210-1224. A first bank of elements, in this example, therefore may include 1210, 1211, 1212, and 1213. A second bank of elements may include items 1214, 1215, 1216 and 1217. A third bank of elements may be represented by elements 1218, 1219, 1220 and 1221. In addition, a forth bank of elements may be represented by elements 1222, 1223 and 1224. In this example the forth battery element in the fourth bank may not be connected, but may rather be used as an interconnection element through the battery element to the antenna element item 1291.

In some embodiments, each of these banks may share a common ground line for the three or four elements that are connected in the bank. For illustrative purposes, bank one, including items 1210, 1211, 1212 and 1213 may share a common ground line shown as item 1230. Additionally, each of the elements may then have a separate line connecting them to the interconnect layer which may be represented by the circuit element 1290. It may be clear that numerous differences in the connection, count and in fact the make-up of each battery element may comprise art within the scope of this inventive art. Moreover, it may be possible that each battery element has both a common and a biased electrode separately connected to the interconnect layer.

As mentioned, in some embodiments of the type shown in item 1200, where banks of battery elements share a common ground that battery element 1213 may share the common bank a common connection, item 1230 and also have its own bias connection of item 1235. These connections may interface with the interconnection element 1290 and then continue on to the power management element identified in this figure as item 1205. The two connections may have corresponding input connections into the power management unit where 1240 may be a continuation of the bank a common ground connection 1230 and item 1245 may be a continuation of the battery element 1213 bias connection 1235. Thus, the individual battery element may be connected to the power management entity and switches may control how it is electrically connect to further elements.

In some embodiments, the four banks of fifteen multiple energization units may all in fact be connected in a parallel fashion generating a raw battery power supply that has the same voltage condition of the battery elements and a combined battery capacity of the fifteen units. The power management unit, 1205, may connect each of the fifteen elements 1210-1224 in such a parallel fashion. In alternative embodiments, the power management element may refine and alter the input power to result in a refined power output that will be supplied to the rest of the stacked integrated component device. It may be apparent that numerous electrical refinements may be performed by the power management element, including in a non-limiting sense regulating all the elements to match a standard reference voltage output; multiplying the voltage of the individual elements, regulating the current outputted by the combined battery elements and many other such refinements.

In some embodiments, whatever conditioning of the power conditions of the combination of 15 elements may be performed, the raw output of the power management unit may be connected to the interconnection layer as shown by element 1250. This power supply may be passed through the interconnection device and electrically fed to the integrated passive device element 1206.

Within the integrated passive device element, 1206 there may be capacitors. The raw power supply connection that comes from the interconnect 1255 may be used to charge the capacitors to the voltage condition of the raw power supply. In some embodiments, the charging may be controlled by an active element, in other embodiments it may just be passed onto the capacitor element. The resulting connection of the capacitor may then be identified as a first power supply condition for the stacked integrated component devices as indicated as element 1260 in item 1200. While the storing of energy in capacitors may in some embodiments be carried out in a separate integrated passive device element, in this case depicted as item 1206, in other embodiments capacitors may be included as part of the power management device itself or on the other components that are drawing power from the power management device. As well, in some additional embodiments there may a combination of capacitors in the integrated passive devices as well as capacitors in the power management element and in the elements that otherwise draw current in the stacked integrated component device with energization.

There may be numerous motivations for conditioning the power provided by multiple energization units. An exemplary motivation, in some embodiments may derive from the power requirements of the components that are connected. If these elements have different operating states that require different current conditions, then the current draw of the highest operating state current draw may be buffered by the presence of the capacitors. Thus, the capacitors may store significantly more current capacity then the fifteen elements may be able to provide at a given point in time. Depending on the conditions of the current drawing element and of the nature of the capacitors in the IPD item 1206 there may still be a limitation of the amount of time a transient high current drawing state may occur for. Since the capacitors would need to be recharged after such a draw on their current capacity, it may be obvious as well that there would need to be a sufficient time between reoccurrences of the high current draw condition. Therefore, it may be clear that there could be a large number of different design aspects relating to the number of energization units, their energy capacities, the types of devices they connect to and the design power requirements of the elements that are provided energy by these energization elements, the power management system and the integrated passive devices.

Voltage Supply Aspects of Multiple Energization Units:

In some examples of stacked integrated component devices with multiple energization units, the combination of the batteries into different series and parallel connections may define different embodiments. When two energization units are connected in a series manner the voltage output of the energization elements add to give a higher voltage output. When two energization units are connected in a parallel manner the voltage remains the same but the current capacities add. It may be apparent that in some embodiments, the interconnection of energization elements may be hardwired into the design of the element. In other embodiments however, the elements may be combined through use of switching elements to define different power supply conditions that may be dynamically defined.

Figure 13:
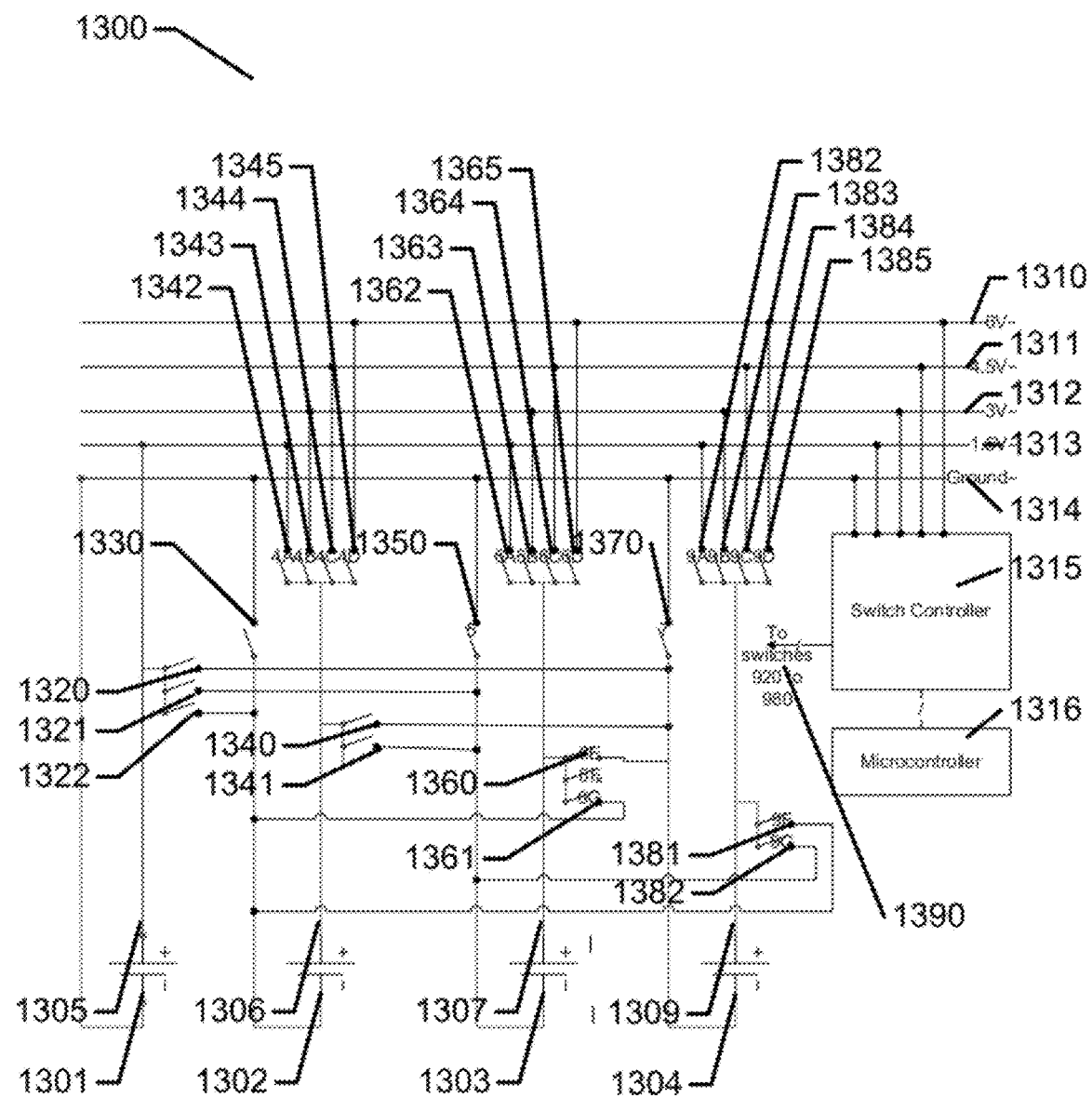
FIG. 13 illustrates an exemplary flexible power supply embodiment utilizing multiple energization elements.

Proceeding to FIG. 13, item 1300 an example of how switches may be used to define up to 4 different voltage supplies from the switched combination of four different energization elements is shown. It may be apparent, that the number of elements is provided in an exemplary sense and that many different combinations would define similar art within the spirit of the inventive art herein. As well, items 1301, 1302, 1303 and 1304 may define the ground connections of four different energization elements, or in some embodiments these may represent the ground connections of four different banks of energization elements as was demonstrated in the description of FIG. 12. In an exemplary sense, items 1305, 1306, 1307 and 1309 may define bias connections to each of the four depicted energization elements where the bias connection may assume a nominal voltage condition which may be 1.5 volts higher than the individual element ground connections, 1301,1302, 1303 and 1304.

As shown in FIG. 13, there may be a microcontroller, item 1316, that is included in the stacked integrated component device which, among its various control conditions may control the number of power supplies that the multiple energization units are connected to define. The microcontroller in some embodiments, may connect to a switch controller, item 1315, which may index control signal level changes from the microcontroller into state changes to the individual switches. For ease of presentation, the output of item 1315 is shown as a single item 1390. In this set of embodiments, this signal is meant to represent the individual control lines that go out to the variety of switches depicted as items 1320 through 1385. There may be numerous types of switches that are consistent with the spirit of the inventive art herein, however in a non-limiting sense the switches may be mosfet switches in an exemplary sense. It may be apparent that any of the numerous mechanical and electrical type switches or other switch types that may be controlled by an electrical signal may comprise art within the spirit of the inventive art herein.

The control of the switches may be used to generate a number of different voltage conditions according to the circuit embodiment of item 1300. As a starting example, the switches may be configured so that there are two different voltage conditions defined; both the 1.5 volt condition shown as item 1313 and the 3 volt condition shown as item 1312. There are numerous ways for this to happen, but for example the following manner will be described where two different elements are used for each of the voltage conditions. One may consider combining the elements represented by their ground connections of item 1301 and 1302 as the 1.5 volt supply elements. For this to occur, item 1305, the bias connection for the first energization element may be observed to already connect to the 1.5 volt supply line item 1313. For the second energization element bias connection, 1306 to connect to supply line 1313 switch 1342 may be turned to a connected state while switches 1343, 1344 and 1345 may be configured in a non-connected state. The ground connection of the second energization element may now be connected to the ground line, 1314 by activating switch 1330 to define the second, 3 volt supply line, item 1312, the common/ground connections of the third, 1303 and forth, 1304 elements may be connected to the 1.5 volt supply line, 1313. For this to be enacted for the third element, switch 1321 may be activated, whereas switches 1320 and 1322 may be deactivated. This may cause connection 1303 to be at the 1.5 volt condition of element 1313. Switch 1350 may be deactivated in this case. For the fourth element, switch 1340 should be activated. Switch 1341 may also be activated, however if it is inactive the same condition may exist. Switch 1370 may be deactivated so that the connection to the ground line is not made.

The bias connections of the third, 1307 and forth elements, 1309 may now be connected to the 3 volt power line 1313. For the third element connection, switch 1363 should be active while switches 1362, 1364 and 1365 may be inactivated. For the fourth element 1309, switch 1383 may be active while switches 1382, 1384 and 1385 may be inactive. This set of connections may define one of the embodiments that may result in such a two level (1.5 and 3 Volt) rough power supply condition through the exemplary use of 4 energization units.

The embodiments that may derive from the connections illustrated in FIG. 13, item 1300 may result in a number of different power supply conditions that may result from the use of four energization elements or four banks of energization elements. It may be apparent that many more connections of energization elements may be consistent with the inventive art herein. In a non-limiting sense, there may be as few as two energization elements or any number more than that which may be consistent with a stacked integrated component device. In any of these embodiments, there may be similar concepts for switching the connections of the ground and bias side of the energization elements into parallel and series connection which may result in multiples of the energization voltage of the individual energization element voltage; if the multiple energization elements are of the same type, or in combination voltages if different types and voltages of individual energization elements are included in a multiple energization elements embodiment.

The description of a type of embodiment utilizing the switching infrastructure of FIG. 13 may in some embodiments describe a set of connections that may be programmed into a Stacked Integrated component device and then utilized for the lifetime of the resulting device embodiment. It may be clear to one skilled in the art that alternative dynamic embodiments may exist. For example, a stacked integrated component device may have operational modes programmed where the number or nature of its power supplies may dynamically change. In a non-limiting exemplary sense, referring to FIG. 13, item 1310 may represent a power supply line of the device where in some modes it is not connected to any energization element connections as may be the case if switches 1345, 1365 and 1385 are in a non-activated connection. Other modes of embodiments of this type may result in the connection of one or more of switches 1345, 1365 and 1385 resulting in a defined energization voltage for the power supply of item 1310. This dynamic activation of a particular voltage may also include deactivation at a later time or alternatively a dynamic change to another operating energization voltage. There may be a significant diversity of operational embodiments that may derive from the inventive art herein when stacked integrated component devices are included with multiple energization elements which may be connected in static and dynamic manners to other elements of the stacked integrated component device.

Self-Testing and Reliability Aspects of Multiple Energization Units:

The nature of energization elements may include aspects where when the elements are assembled into stacked integrated component devices they may have failure modes that may have the nature of an initial or "time zero" failure or alternatively be an aged failure where an initially function element may fail during the course of its use. The characteristics of stacked integrated component devices with multiple energization elements allow for embodiments of circuitry and design which allow for remediating such failure modes and maintaining a functional operational state.

Returning to FIG. 12, item 1200 some embodiments of self-testing and repair may be illustrated in an exemplary sense. Consider an embodiment type where the fifteen multiple energization elements, 1210 to 1224 are all connected in a parallel manner to define one power supply condition based on the standard operating voltage of each element. As mentioned, the nature of combining these multiple number of energization may allow the Stacked Integrated Component Device to perform self-testing and repair if an energization unit is defective or becomes defective.

Figure 14:
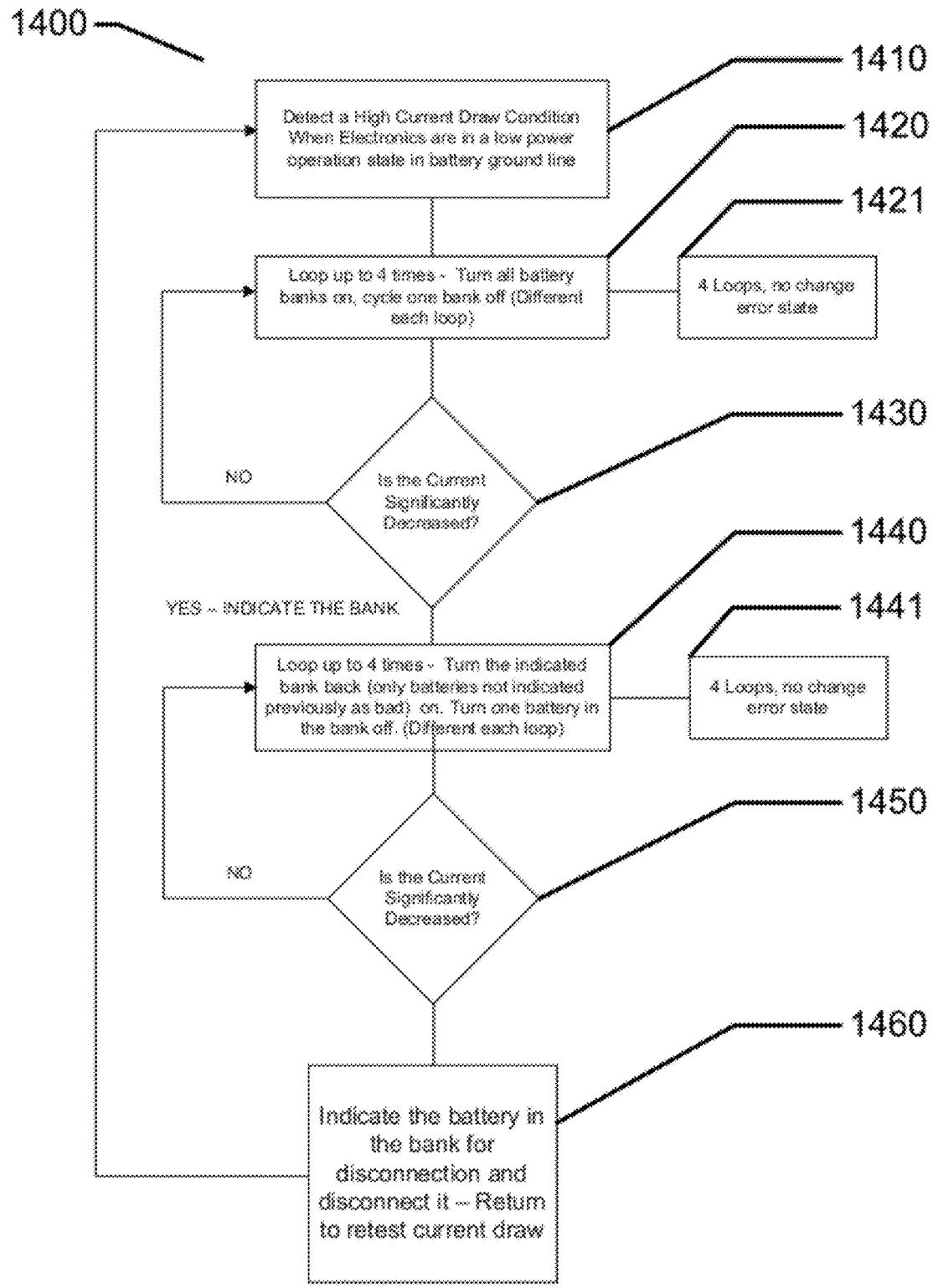
FIG. 14 illustrates is a flowchart with exemplary method steps for self-diagnostic procedures for stacked integrated component devices with multiple energization elements.

Proceeding to FIG. 14, item 1400 with the embodiment described above in mind, a sensing element may be used to detect the current flowing through the energization devices, depicted as item 1410. There may be numerous ways to set a condition in the stacked integrated component device where its current may be at a standard value. In an exemplary sense, the device could have a "Sleep mode" that it activates where the quiescent current draw is at a very low value. The sensing protocol may be as straightforward as inserting a resistive element into the power supply ground return line; although more sophisticated means of measuring current flow including magnetic or thermal transducers or any other means of performing electrical current metrology may be consistent with the spirit of the art herein. If the diagnostic measurement of the current flow; in some embodiments represented as a voltage drop through the resistive element compared to a reference voltage is found to exceed a standard tolerance then the exemplary self-test circuitry may proceed to determine if one of the energization elements is causing the excessive current draw condition. In proceeding, one exemplary manner of isolating the cause, as shown in item 1420 may be to first cycle through isolating one of the four banks at a time by disconnecting its ground return line. Referring back to FIG. 12, item 1200 for example the bank of elements 1210,1211, 1212 and 1213 may be the first bank to be isolated. Ground line 1230 may be disconnected. The same electrical current draw metrology may next be performed after the isolation as shown by item 1430. If the current sensed has now returned to a normal current draw then the problem may be indicated to occur in that bank. If, alternatively, the current still remains out of a specified condition then the logical looping process can proceed to the next bank and back to item 1420. It may be possible that after looping through all the banks, which in this exemplary sense may be four banks, that the current draw is still outside of the normal tolerance. In such a case, in some embodiments, the self-testing protocol may then exit its test of the energization elements and then either stop self-testing or initiate self-testing for some other potential current draw issue. In describing this self-testing protocol, it may be apparent that an exemplary protocol has been described to illustrate the concepts of the inventive art herein and that numerous other protocols may result in a similar isolation of individual energization units which may be malfunctioning.

Proceeding with the exemplary protocol, when the current flow returns to a normal specification when a bank has been isolated a next isolation loop may be performed in some embodiments. As shown in item 1440, the individual bank may again be activated however each of the four elements, for example 1210, 1211, 1212 and 1213 may have their bias connection disconnected, where for example 1235 may represent the bias connection of element 1213. Again, after an element is isolated, the current draw may again be sensed as shown in item 1450. If the isolation of an element returns the current draw to a normal state then that element may be indicated as defective and disconnected from the power supply system. In such cases, the self-test protocol may in some embodiments, return item 1460, to its initial state (With the defective element now shut off) and retest that the current is within spec.

Figure 15:
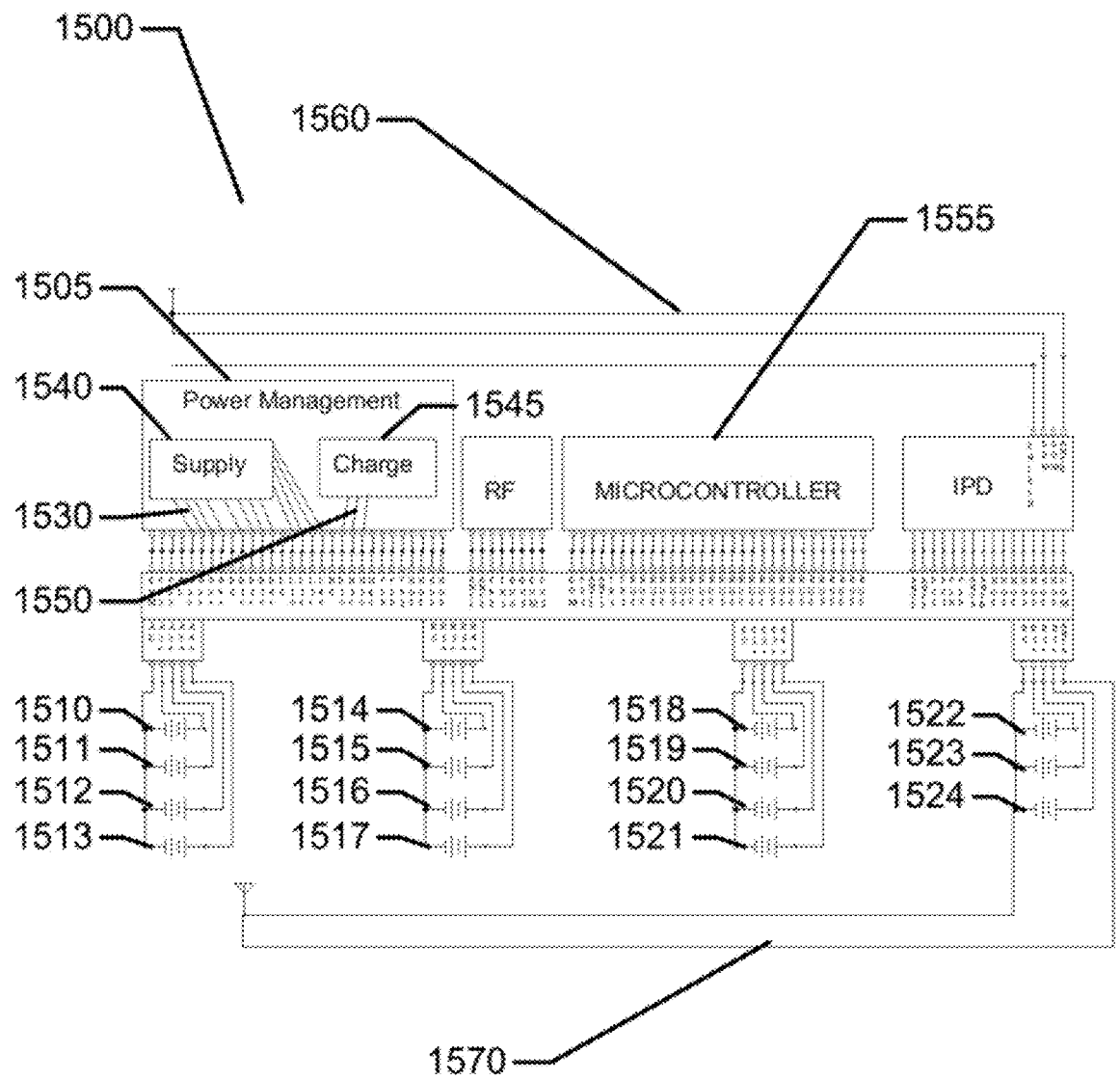
FIG. 15 illustrates an exemplary stacked integrated component device wherein multiple energization elements are in operations for both charging and discharging.

If the second looping process as shown by elements 1440 and 1450 proceeds through all energization elements in a bank without the current returning to an acceptable value the loop may end as shown by element 1441. In such an event, the self-test circuitry may then proceed to disable the entire bank from the power supply system, or in other embodiments it may proceed with a different manner of isolating elements in the bank; which for this example is not depicted. There may be numerous manners to define self-diagnostic protocols for multiple energization units and the actions that are programmed to occur based on these protocols. Simultaneous Charging and Discharging in Multiple Energization Units Proceeding now to FIG. 15 item 1500, another set of embodiments that may result from integrating multiple energization elements into stacked integrated component devices may be seen. In some embodiments, where there are multiple energization elements, items 1511 to 1524, and there are elements within the stacked integrated device, 1500, which may be useful for recharging an energization element, there may be the ability to charge some of the elements which the remainder of the elements are simultaneously being used to power components which are functioning.

In an exemplary set of embodiments, a stacked integrated component device containing multiple energization elements may be capable of receiving and processing rf signals from an antenna, 1570, comprised within its device. In some embodiments, there may exist a second antenna, item 1560, which is useful for receiving wireless energy from the environment of the device and passing this energy to a power management device, item 1505. In an exemplary sense, there may be included a microcontroller element, item 1555 which is both drawing power from the stacked integrated component device's energization units and also controlling the operations within the device. This microcontroller, 1555, may process input information to it using programmed algorithms to determine that the energization system of the fifteen elements, 1511 to 1524, may have enough energy to support the power requirements of the current device function where only a subset of the elements are being used to power the supply controlling circuitry, item 1540, of the power management device and the resulting power supply to the rest of the components that this circuitry defines. In such exemplary embodiments, the remaining elements may then be connected to the charging circuitry, item 1545, of the power management component which may be receiving the power, as mentioned previously, that is being received by antenna 1560. In the embodiment depicted in FIG. 15 item 1500, for example the stacked integrated component device may be placed into a state where three of the multiple energization elements, items 1522, 1523 and 1524 may be connected as for example shown form item 1523 as item 1150, to the charging electronics. Simultaneously, the remaining 12 elements, items 1511 to 1521 may be connected to the supply circuitry, 1540 as is shown for example for element 1511 as item 1530. In this manner, a stacked integrated component device with energization may be enabled, through the use of multiple energization elements to operate in modes where the elements are both being charged and discharged simultaneously. The depiction of this exemplary simultaneous charging and discharging mode is provided as but one of numerous manners that multiple energization elements may be configured to perform multiple functions within a stacked integrated component device with energization, and it is not intended that such an example limits in any way the large diversity of embodiments that may be possible.

The invention claimed is:

1. A stacked integrated component device with multiple energization elements for an ophthalmic lens including powered components, comprising:
   a first layer comprising a first surface;
   a second layer comprising a second surface, wherein at least a portion of the first layer lays above at least a portion of the second layer such that they overlap only partially and form a three dimensional structure configured to match a profile of the ophthalmic lens;
   at least one electrical connection between a first electrical contact on the first surface and a second electrical contact on the second surface;
   at least one electrical transistor, wherein the at least one electrical transistor is located within the stacked integrated component device; and
   at least a first and a second discrete energization element located within at least one of the first layer and the second layer.

2. The stacked integrated component device of claim 1, wherein the first and the second discrete energization elements each have a thicknesses of less than 200 microns.

3. The stacked integrated component device of claim 1, additionally comprising:
   a first electrical common connection in contact with a first ground connection of the first discrete energization element;
   a second electrical common connection in contact with a second ground connection of the second discrete energization element;
   a first electrical bias connection in contact with a first bias connection of the first discrete energization element; and
   a second electrical bias connection in contact with a second bias connection of the second discrete energization element.

4. The stacked integrated component device of claim 3, wherein the first electrical common connection is electrically connected to the second electrical common connection forming a single common connection for the first and the second discrete energization elements.

5. The stacked integrated component device of claim 4, wherein the first electrical bias connection is electrically connected to the second electrical bias connection forming a single bias connection for the first and the second discrete energization elements.

6. The stacked integrated component device of claim 3, wherein:
   the first electrical bias connection is electrically connected to a first power supply input of a first integrated circuit; and
   the second electrical bias connection is electrically connected to a second power supply input of the first integrated circuit.

7. The stacked integrated component device of claim 6, wherein:
   the first integrated circuit generates a first output power supply; and
   a second integrated circuit is electrically connected to the first output power supply.

8. The stacked integrated component device of claim 7, wherein:
   the first integrated circuit combines, with at least a first switch, the first power supply input and the second power supply input to create the first output power supply,
   the first output supply having a voltage capability equivalent to the first and the second discrete energization elements, and
   the first output supply having a combined electrical current capability of the first and the second discrete energization elements.

9. The stacked integrated component device of claim 7, wherein:
   the first integrated circuit combines, with at least a first switch, the first power supply input and the second electrical common connection to create the first output power supply,
   the first output supply having a current capability of the lesser of the electrical current capability of the first and the second discrete energization elements, and
   the first output supply having a combined electrical bias of the first and the second discrete energization elements.

10. The stacked integrated component device of claim 7, wherein each of the electrical connections from the first layer and the second layer are not connected to an external wired connection of the stacked integrated component device.

11. The stacked integrated component device of claim 1, additionally comprising at least a third and a fourth discrete energization element located within the stacked integrated component device.

12. The stacked integrated component device of claim 1, wherein the discrete energization elements create more than one raw power supply.

13. The stacked integrated component device of claim 12, wherein at least a first raw power supply is electrically connected to a capacitive element separate from the discrete energization elements.

14. A stacked integrated component device with multiple energization elements for an ophthalmic lens including powered components, comprising:
   a first layer comprising a first surface, and
   a second layer comprising a second surface,
   wherein at least a portion of the first layer lays above at least a portion of the second layer such that they partially overlap and form a three dimensional structure configured to match a profile of the ophthalmic lens;
   at least one electrical connection between a first electrical contact on the first surface and a second electrical contact on the second surface;
   at least one electrical transistor, wherein the at least one electrical transistor is located within the stacked integrated component device; and
   at least a first and a second discrete energization element located within at least one of the first layer and the second layer,
   wherein the first and the second discrete energization elements simultaneously provide power.

15. The stacked integrated component device of claim 14, wherein the first discrete energization element is located within the first layer and the second discrete energization elements is located within the second layer.

16. The stacked integrated component device of claim 14, wherein the first and the second discrete energization elements are both located in either one of the first layer and the second layer.

17. The stacked integrated component device of claim 14, wherein the first discrete energization element generates a first raw battery power and the second discrete energization element generates a second raw battery power.

18. The stacked integrated component device of claim 17, additionally comprising a power management unit electrically connected to the first and the second discrete energization elements, wherein the power management unit receives the first raw battery power from the first discrete energization element and the second raw battery power from the second discrete energization element.

19. The stacked integrated component device of claim 18, wherein the power management unit refines and alters the first raw battery power and the second raw battery power resulting in a refined power output.

20. The stacked integrated component device of claim 19, additionally comprising an integrated passive device in electrical connection with the power management unit, wherein the integrated passive device comprises a number of capacitors connected to at least one of the discrete energization elements.

21. The stacked integrated component device of claim 20, wherein the integrated passive device holds the refined power output provided by the power management unit.

22. The stacked integrated component device of claim 14, additionally comprising a microcontroller located within the stacked integrated component device controlling the discrete energization elements.

23. The stacked integrated component device of claim 22, additionally comprising a switch controller in electrical connection with the microcontroller, wherein the switch controller is configured to change a state of each of a plurality of switches in response to a signal from the microcontroller.

24. The stacked integrated component device of claim 23, wherein the switches control a number of different voltage conditions for the stacked integrated component device.

25. The stacked integrated component device of claim 23, wherein the microcontroller determines whether at least one of the discrete energization elements generates enough power to support a power requirement of the stacked integrated component device.

26. The stacked integrated component device of claim 25, additionally comprising a first and a second antenna, wherein the first antenna is capable of receiving radio frequency signals and the second antenna is capable of receiving wireless energy from an environment of the stacked integrated component device.

27. The stacked integrated component device of claim 23, additionally comprising a plurality of sets of discrete energization elements, wherein a first set of discrete energization elements is connected to only one of a plurality of voltage supply lines and each of the remaining sets of discrete energization elements is connected to each of the voltage supply lines.

28. The stacked integrated component device of claim 27, wherein each of the remaining sets of discrete energization elements is connected to each of the voltage supply lines by a separate switch.

29. The stacked integrated component device of claim 27, wherein each set of discrete energization elements is also connected to a plurality of switches, wherein each of the switches connects to a bias connection of each of the remaining sets of discrete energization elements.

30. The stacked integrated component device of claim 26, wherein the first antenna is electrically connected to the discrete energization elements and the second antenna is connected to an integrated passive device element.

* * * * *